(12) United States Patent
Haverkamp et al.

(10) Patent No.: US 8,980,769 B1
(45) Date of Patent: Mar. 17, 2015

(54) MULTI-STATION SEQUENTIAL CURING OF DIELECTRIC FILMS

(75) Inventors: Jason Haverkamp, Tualatin, OR (US); Dennis Hausmann, Lake Oswego, OR (US); Kevin McLaughlin, Sherwood, OR (US); Krishnan Shrinivasan, San Jose, CA (US); Michael Rivkin, Los Altos, CA (US); Eugene Smargiassi, Tualatin, OR (US); Mohamed Sabri, Beaverton, OR (US)

(73) Assignee: Novellus Systems, Inc., San Jose, CA (US)

( * ) Notice: Subject to any disclaimer, the term of this patent is extended or adjusted under 35 U.S.C. 154(b) by 918 days.

(21) Appl. No.: 11/977,792

(22) Filed: Oct. 25, 2007

Related U.S. Application Data

(63) Continuation-in-part of application No. 11/688,695, filed on Mar. 20, 2007, which is a continuation-in-part of application No. 11/369,311, filed on Mar. 6, 2006, which is a continuation-in-part of application No. 11/115,576, filed on Apr. 26, 2005.

(51) Int. Cl.
*H01L 21/00* (2006.01)
*H01L 21/331* (2006.01)

(52) U.S. Cl.
USPC .......................................... 438/795; 438/378

(58) Field of Classification Search
None
See application file for complete search history.

(56) References Cited

U.S. PATENT DOCUMENTS

| | | | |
|---|---|---|---|
| 3,504,181 A | 3/1970 | Campbell et al. | |
| 3,704,219 A | 11/1972 | McDowell | |
| 3,983,385 A | 9/1976 | Troue | |
| 4,313,969 A | 2/1982 | Matthews et al. | |
| 4,357,451 A | 11/1982 | McDaniel | |
| 4,391,663 A | 7/1983 | Hutter, III | |
| 4,563,589 A | 1/1986 | Scheffer | |
| 4,654,226 A | 3/1987 | Jackson et al. | |
| 4,751,191 A | 6/1988 | Gonsiorawski et al. | |
| 4,837,289 A | 6/1989 | Mueller et al. | |

(Continued)

FOREIGN PATENT DOCUMENTS

| | | |
|---|---|---|
| CN | 1531749 A | 9/2004 |
| CN | 1624895 | 6/2005 |

(Continued)

OTHER PUBLICATIONS

Cho et al., "Plasma Treatments of Molecularly Templated Nanoporous Silica Films," Electrochemical and Solid-State Letters, 4 (4) G35-G38 (2001).

(Continued)

*Primary Examiner* — Seahvosh Nikmanesh
(74) *Attorney, Agent, or Firm* — Weaver Austin Villeneuve & Sampson

(57) ABSTRACT

The present invention provides improved methods of preparing a low-k dielectric material on a substrate. The methods involve multiple operation ultraviolet curing processes in which UV intensity, wafer substrate temperature, UV spectral distribution, and other conditions may be independently modulated in each operation. Operations may be pulsed or even be concurrently applied to the same wafer. In certain embodiments, a film containing a structure former and a porogen is exposed to UV radiation in a first operation to facilitate removal of the porogen and create a porous dielectric film. In a second operation, the film is exposed to UV radiation to increase cross-linking within the porous film.

16 Claims, 3 Drawing Sheets

(56) References Cited

U.S. PATENT DOCUMENTS

| | | |
|---|---|---|
| 4,872,947 A | 10/1989 | Wang et al. |
| 4,885,262 A | 12/1989 | Ting et al. |
| 4,927,786 A | 5/1990 | Nishida |
| 4,956,582 A | 9/1990 | Bourassa |
| 5,005,519 A | 4/1991 | Egermeier et al. |
| 5,166,101 A | 11/1992 | Lee et al. |
| 5,174,881 A | 12/1992 | Iwasaki et al. |
| 5,178,682 A | 1/1993 | Tsukamoto et al. |
| 5,195,045 A | 3/1993 | Keane et al. |
| 5,249,076 A | 9/1993 | Fujiwara et al. |
| 5,268,320 A | 12/1993 | Holler et al. |
| 5,282,121 A | 1/1994 | Bornhorst et al. |
| 5,288,684 A | 2/1994 | Yamazaki et al. |
| 5,298,939 A | 3/1994 | Swanson et al. |
| 5,300,331 A | 4/1994 | Schaeffer |
| 5,314,538 A | 5/1994 | Maeda et al. |
| 5,354,715 A | 10/1994 | Wang et al. |
| 5,364,667 A | 11/1994 | Rhieu |
| 5,407,524 A | 4/1995 | Patrick et al. |
| 5,413,664 A | 5/1995 | Yagi et al. |
| 5,426,076 A | 6/1995 | Moghadam et al. |
| 5,504,042 A | 4/1996 | Cho et al. |
| 5,518,959 A | 5/1996 | Jang et al. |
| 5,552,927 A | 9/1996 | Wheatly et al. |
| 5,556,549 A | 9/1996 | Patrick et al. |
| 5,558,717 A | 9/1996 | Zhao et al. |
| 5,582,880 A | 12/1996 | Mochizuki et al. |
| 5,667,592 A | 9/1997 | Boitnott et al. |
| 5,674,783 A | 10/1997 | Jang et al. |
| 5,686,054 A | 11/1997 | Barthel et al. |
| 5,700,844 A | 12/1997 | Hedrick et al. |
| 5,734,187 A | 3/1998 | Bohr et al. |
| 5,789,027 A | 8/1998 | Watkins et al. |
| 5,812,403 A | 9/1998 | Fong et al. |
| 5,833,290 A | 11/1998 | Curelop et al. |
| 5,840,600 A | 11/1998 | Yamazaki et al. |
| 5,851,715 A | 12/1998 | Barthel et al. |
| 5,858,457 A | 1/1999 | Brinker et al. |
| 5,876,798 A | 3/1999 | Vassiliev |
| 5,877,095 A | 3/1999 | Tamura et al. |
| 5,962,085 A | 10/1999 | Hayashi et al. |
| 6,015,503 A | 1/2000 | Butterbaugh et al. |
| 6,080,965 A | 6/2000 | Osawa |
| 6,090,442 A | 7/2000 | Klaus et al. |
| 6,098,637 A | 8/2000 | Parke |
| 6,132,814 A | 10/2000 | Livesay et al. |
| 6,136,680 A | 10/2000 | Lai et al. |
| 6,140,252 A | 10/2000 | Cho et al. |
| 6,143,063 A | 11/2000 | Hayashi et al. |
| 6,150,272 A | 11/2000 | Liu et al. |
| 6,228,563 B1 | 5/2001 | Starov et al. |
| 6,232,248 B1 | 5/2001 | Shinriki et al. |
| 6,239,018 B1 | 5/2001 | Liu et al. |
| 6,244,575 B1 | 6/2001 | Vaartstra et al. |
| 6,254,689 B1 | 7/2001 | Meder |
| 6,259,061 B1 | 7/2001 | Osawa |
| 6,268,288 B1 | 7/2001 | Hautala et al. |
| 6,270,846 B1 | 8/2001 | Brinker et al. |
| 6,271,273 B1 | 8/2001 | You et al. |
| 6,280,171 B1 | 8/2001 | Buazza |
| 6,284,050 B1 | 9/2001 | Shi et al. |
| 6,288,493 B1 | 9/2001 | Lee et al. |
| 6,290,589 B1 | 9/2001 | Tolles |
| 6,291,800 B1 | 9/2001 | Shirakawa et al. |
| 6,329,017 B1 | 12/2001 | Liu et al. |
| 6,329,062 B1 | 12/2001 | Gaynor |
| 6,333,268 B1 | 12/2001 | Starov et al. |
| 6,340,628 B1 | 1/2002 | Van Cleemput et al. |
| 6,348,407 B1 | 2/2002 | Gupta et al. |
| 6,365,266 B1 | 4/2002 | MacDougall et al. |
| 6,367,412 B1 | 4/2002 | Ramaswamy et al. |
| 6,383,466 B1 | 5/2002 | Domansky et al. |
| 6,383,955 B1 | 5/2002 | Matsuki et al. |
| 6,386,466 B1 | 5/2002 | Ozawa et al. |
| 6,387,453 B1 | 5/2002 | Brinker et al. |
| 6,391,932 B1 | 5/2002 | Gore et al. |
| 6,392,017 B1 | 5/2002 | Chandrashekar |
| 6,394,797 B1 | 5/2002 | Sugaya et al. |
| 6,399,212 B1 | 6/2002 | Sakai et al. |
| 6,407,007 B1 | 6/2002 | Tsan et al. |
| 6,420,441 B1 | 7/2002 | Allen et al. |
| 6,444,715 B1 | 9/2002 | Mukherjee et al. |
| 6,467,491 B1 | 10/2002 | Sugiura et al. |
| 6,475,854 B2 | 11/2002 | Narwankar et al. |
| 6,479,374 B1 | 11/2002 | Ioka et al. |
| 6,479,409 B2 | 11/2002 | Shioya et al. |
| 6,485,599 B1 | 11/2002 | Glownia et al. |
| 6,518,130 B1 | 2/2003 | Ohno |
| 6,524,389 B1 | 2/2003 | Katayama et al. |
| 6,530,380 B1 | 3/2003 | Zhou et al. |
| 6,531,193 B2 | 3/2003 | Fonash et al. |
| 6,534,395 B2 | 3/2003 | Werkhoven et al. |
| 6,548,113 B1 | 4/2003 | Birnbaum et al. |
| 6,558,755 B2 | 5/2003 | Berry et al. |
| 6,563,092 B1 | 5/2003 | Shrinivasan et al. |
| 6,566,278 B1 | 5/2003 | Harvey et al. |
| 6,568,346 B2 | 5/2003 | Pu et al. |
| 6,572,252 B1 | 6/2003 | Rangarajan et al. |
| 6,576,300 B1 | 6/2003 | Berry et al. |
| 6,596,467 B2 | 7/2003 | Gallagher et al. |
| 6,596,654 B1 | 7/2003 | Bayman et al. |
| 6,629,012 B1 | 9/2003 | Riley et al. |
| 6,635,575 B1 | 10/2003 | Xia et al. |
| 6,644,786 B1 | 11/2003 | Leben |
| 6,677,251 B1 | 1/2004 | Lu et al. |
| 6,740,602 B1 | 5/2004 | Hendriks et al. |
| 6,740,605 B1 | 5/2004 | Shiraiwa et al. |
| 6,756,085 B2 | 6/2004 | Waldfried et al. |
| 6,759,098 B2 | 7/2004 | Han et al. |
| 6,770,866 B2 | 8/2004 | Retschke et al. |
| 6,797,643 B2 | 9/2004 | Rocha-Alvarez et al. |
| 6,800,546 B2 | 10/2004 | Konishi et al. |
| 6,805,801 B1 | 10/2004 | Humayun et al. |
| 6,812,043 B2 | 11/2004 | Bao et al. |
| 6,821,906 B2 | 11/2004 | Wada et al. |
| 6,830,624 B2 | 12/2004 | Janakiraman et al. |
| 6,831,284 B2 | 12/2004 | Demos et al. |
| 6,835,417 B2 | 12/2004 | Saenger et al. |
| 6,848,458 B1 | 2/2005 | Shrinivasan et al. |
| 6,856,712 B2 | 2/2005 | Fauver et al. |
| 6,884,738 B2 | 4/2005 | Asai et al. |
| 6,899,857 B2 | 5/2005 | Pheng et al. |
| 6,900,413 B2 | 5/2005 | Ratliff et al. |
| 6,902,440 B2 | 6/2005 | Dougan et al. |
| 6,921,727 B2 | 7/2005 | Chiang et al. |
| 6,958,301 B2 | 10/2005 | Kim et al. |
| 6,962,871 B2 | 11/2005 | Lee et al. |
| 6,967,160 B1 | 11/2005 | Paton et al. |
| 7,005,390 B2 | 2/2006 | Ramachandrarao et al. |
| 7,017,514 B1 | 3/2006 | Shepherd et al. |
| 7,018,479 B2 | 3/2006 | Goodwin |
| 7,018,918 B2 | 3/2006 | Kloster et al. |
| 7,025,831 B1 | 4/2006 | Butterbaugh et al. |
| 7,030,041 B2 | 4/2006 | Li et al. |
| 7,067,819 B2 | 6/2006 | Janik |
| 7,087,497 B2 | 8/2006 | Yuan et al. |
| 7,094,713 B1 | 8/2006 | Niu et al. |
| 7,097,712 B1 | 8/2006 | Yamazaki et al. |
| 7,112,541 B2 | 9/2006 | Xia et al. |
| 7,132,334 B2 | 11/2006 | Lin |
| 7,144,606 B2 | 12/2006 | Huang |
| 7,148,155 B1 | 12/2006 | Tarafdar et al. |
| 7,166,531 B1 | 1/2007 | van den Hoek et al. |
| 7,169,256 B2 | 1/2007 | Dhindsa et al. |
| 7,176,144 B1 | 2/2007 | Wang et al. |
| 7,195,548 B1 | 3/2007 | Hardikar et al. |
| 7,208,389 B1 | 4/2007 | Tipton et al. |
| 7,214,630 B1 | 5/2007 | Varadarajan et al. |
| 7,235,459 B2 | 6/2007 | Sandhu |
| 7,241,704 B1 | 7/2007 | Wu et al. |
| 7,244,672 B2 | 7/2007 | Nguyen et al. |
| 7,247,582 B2 | 7/2007 | Stern et al. |
| 7,253,125 B1 | 8/2007 | Bandyopadhyay et al. |
| 7,256,111 B2 | 8/2007 | Lopatin et al. |

(56) References Cited

U.S. PATENT DOCUMENTS

| | | |
|---|---|---|
| 7,264,676 B2 | 9/2007 | Lai et al. |
| 7,265,061 B1 | 9/2007 | Cho et al. |
| 7,304,302 B1 | 12/2007 | Nunan et al. |
| 7,332,445 B2 | 2/2008 | Lukas et al. |
| 7,381,659 B2 | 6/2008 | Nguyen et al. |
| 7,390,537 B1 | 6/2008 | Wu et al. |
| 7,394,067 B1 | 7/2008 | Soltz et al. |
| 7,402,532 B2 | 7/2008 | Clevenger et al. |
| 7,481,882 B2 | 1/2009 | Won et al. |
| 7,504,663 B2 | 3/2009 | Yamazaki et al. |
| 7,510,982 B1 | 3/2009 | Draeger et al. |
| 7,538,012 B2 | 5/2009 | Ohmi et al. |
| 7,611,757 B1 | 11/2009 | Bandyopadhyay et al. |
| 7,622,162 B1 | 11/2009 | Schravendijk et al. |
| 7,638,780 B2 | 12/2009 | Kilburn et al. |
| 7,642,205 B2 | 1/2010 | Timans |
| 7,704,894 B1 | 4/2010 | Henry et al. |
| 7,705,431 B1 | 4/2010 | Sanganeria et al. |
| 7,772,527 B2 | 8/2010 | Choi |
| 7,790,633 B1 | 9/2010 | Tarafdar et al. |
| 7,851,232 B2 | 12/2010 | van Schravendijk et al. |
| 7,858,533 B2 | 12/2010 | Liu et al. |
| 7,906,174 B1 | 3/2011 | Wu et al. |
| 7,935,940 B1 | 5/2011 | Smargiassi |
| 8,043,667 B1 | 10/2011 | Bandyopadhyay et al. |
| 8,062,983 B1 | 11/2011 | Draeger et al. |
| 8,063,983 B2 | 11/2011 | Kotake et al. |
| 8,137,465 B1 | 3/2012 | Shrinivasan et al. |
| 8,211,510 B1 | 7/2012 | Varadarajan et al. |
| 8,242,028 B1 | 8/2012 | van Schravendijk et al. |
| 8,454,750 B1 | 6/2013 | Shrinivasan et al. |
| 8,465,991 B2 | 6/2013 | Varadarajan et al. |
| 8,512,818 B1 | 8/2013 | Varadarajan et al. |
| 8,629,068 B1* | 1/2014 | Shrinivasan et al. .......... 438/795 |
| 8,715,788 B1 | 5/2014 | Bandyopadhyay et al. |
| 8,889,233 B1 | 11/2014 | Kelman et al. |
| 2001/0001501 A1 | 5/2001 | Lee et al. |
| 2001/0014512 A1 | 8/2001 | Lyons et al. |
| 2001/0018267 A1 | 8/2001 | Shinriki et al. |
| 2002/0001973 A1 | 1/2002 | Wu et al. |
| 2002/0015850 A1 | 2/2002 | Nakamura et al. |
| 2002/0016085 A1 | 2/2002 | Huang et al. |
| 2002/0017242 A1 | 2/2002 | Hamaguchi et al. |
| 2002/0034626 A1 | 3/2002 | Liu et al. |
| 2002/0052124 A1 | 5/2002 | Raaijmakers et al. |
| 2002/0064341 A1 | 5/2002 | Fauver et al. |
| 2002/0106500 A1 | 8/2002 | Albano et al. |
| 2002/0117109 A1 | 8/2002 | Hazelton et al. |
| 2002/0123218 A1 | 9/2002 | Shioya et al. |
| 2002/0123240 A1 | 9/2002 | Gallagher et al. |
| 2002/0134439 A1 | 9/2002 | Kawasaki et al. |
| 2002/0148563 A1 | 10/2002 | Carlson et al. |
| 2002/0172766 A1 | 11/2002 | Laxman et al. |
| 2002/0187627 A1 | 12/2002 | Yuang |
| 2002/0195683 A1 | 12/2002 | Kim et al. |
| 2003/0013280 A1 | 1/2003 | Yamanaka |
| 2003/0015764 A1 | 1/2003 | Raaijmakers et al. |
| 2003/0064604 A1 | 4/2003 | Umeda |
| 2003/0064607 A1 | 4/2003 | Leu et al. |
| 2003/0068881 A1 | 4/2003 | Xia et al. |
| 2003/0134038 A1 | 7/2003 | Paranjpe |
| 2003/0157248 A1 | 8/2003 | Watkins et al. |
| 2003/0157267 A1* | 8/2003 | Waldfried et al. ............ 427/488 |
| 2003/0194493 A1 | 10/2003 | Chang et al. |
| 2003/0199603 A1 | 10/2003 | Walker et al. |
| 2003/0200931 A1 | 10/2003 | Goodwin |
| 2003/0203321 A1 | 10/2003 | Ma et al. |
| 2003/0227087 A1 | 12/2003 | Kakamu et al. |
| 2003/0228769 A1 | 12/2003 | Chen et al. |
| 2003/0228770 A1 | 12/2003 | Lee et al. |
| 2004/0002617 A1 | 1/2004 | Rantala et al. |
| 2004/0004247 A1 | 1/2004 | Forbes et al. |
| 2004/0018319 A1 | 1/2004 | Waldfried et al. |
| 2004/0022960 A1 | 2/2004 | Rhee et al. |
| 2004/0023513 A1 | 2/2004 | Aoyama et al. |
| 2004/0029391 A1 | 2/2004 | Kirkpatrick et al. |
| 2004/0033662 A1 | 2/2004 | Lee et al. |
| 2004/0058090 A1 | 3/2004 | Waldfried et al. |
| 2004/0062633 A1 | 4/2004 | Rice et al. |
| 2004/0069410 A1 | 4/2004 | Moghadam et al. |
| 2004/0072405 A1 | 4/2004 | Yao et al. |
| 2004/0082163 A1 | 4/2004 | Mori et al. |
| 2004/0096593 A1 | 5/2004 | Lukas et al. |
| 2004/0096672 A1 | 5/2004 | Lukas et al. |
| 2004/0099915 A1 | 5/2004 | Takayama et al. |
| 2004/0099952 A1 | 5/2004 | Goodner et al. |
| 2004/0101633 A1 | 5/2004 | Zheng et al. |
| 2004/0102031 A1 | 5/2004 | Kloster et al. |
| 2004/0115933 A1 | 6/2004 | Jung et al. |
| 2004/0152239 A1 | 8/2004 | Bao et al. |
| 2004/0166240 A1 | 8/2004 | Rhee et al. |
| 2004/0175501 A1 | 9/2004 | Lukas et al. |
| 2004/0175957 A1 | 9/2004 | Lukas et al. |
| 2004/0185679 A1 | 9/2004 | Ott et al. |
| 2004/0221871 A1 | 11/2004 | Fletcher et al. |
| 2004/0224496 A1 | 11/2004 | Cui et al. |
| 2004/0266214 A1 | 12/2004 | Suguro et al. |
| 2005/0006916 A1 | 1/2005 | Mantz |
| 2005/0016687 A1 | 1/2005 | Shinriki et al. |
| 2005/0025892 A1 | 2/2005 | Satoh et al. |
| 2005/0026454 A1 | 2/2005 | Konishi et al. |
| 2005/0032293 A1 | 2/2005 | Clark et al. |
| 2005/0056369 A1 | 3/2005 | Lai et al. |
| 2005/0064712 A1 | 3/2005 | Andreas |
| 2005/0064726 A1 | 3/2005 | Reid et al. |
| 2005/0072716 A1 | 4/2005 | Quiles et al. |
| 2005/0079717 A1 | 4/2005 | Savas et al. |
| 2005/0085094 A1 | 4/2005 | Yoo |
| 2005/0095840 A1 | 5/2005 | Bhanap et al. |
| 2005/0098553 A1 | 5/2005 | Devine et al. |
| 2005/0101154 A1 | 5/2005 | Huang |
| 2005/0112282 A1 | 5/2005 | Gordon et al. |
| 2005/0153533 A1 | 7/2005 | Hoshino et al. |
| 2005/0156285 A1 | 7/2005 | Gates et al. |
| 2005/0161821 A1 | 7/2005 | Lee et al. |
| 2005/0164497 A1* | 7/2005 | Lopatin et al. ................ 438/678 |
| 2005/0170104 A1 | 8/2005 | Jung et al. |
| 2005/0191803 A1 | 9/2005 | Matsuse et al. |
| 2005/0194619 A1 | 9/2005 | Edelstein et al. |
| 2005/0196929 A1 | 9/2005 | Yuan et al. |
| 2005/0208758 A1 | 9/2005 | Lu et al. |
| 2005/0233598 A1 | 10/2005 | Jung et al. |
| 2005/0255712 A1 | 11/2005 | Kato et al. |
| 2005/0260357 A1 | 11/2005 | Olsen et al. |
| 2005/0260420 A1 | 11/2005 | Collins et al. |
| 2005/0263719 A1 | 12/2005 | Ohdaira et al. |
| 2005/0264218 A1 | 12/2005 | Dhindsa et al. |
| 2005/0272220 A1 | 12/2005 | Waldfried et al. |
| 2006/0021568 A1 | 2/2006 | Matsumoto |
| 2006/0024976 A1 | 2/2006 | Waldfried et al. |
| 2006/0027929 A1 | 2/2006 | Cooney et al. |
| 2006/0046516 A1 | 3/2006 | Weber |
| 2006/0063662 A1 | 3/2006 | Hata et al. |
| 2006/0074153 A1 | 4/2006 | Boisseau et al. |
| 2006/0105106 A1 | 5/2006 | Balseanu et al. |
| 2006/0110936 A1 | 5/2006 | Hill et al. |
| 2006/0118817 A1 | 6/2006 | Haisma |
| 2006/0121208 A1 | 6/2006 | Siegel |
| 2006/0141806 A1 | 6/2006 | Waldfried et al. |
| 2006/0142143 A1 | 6/2006 | Abrevaya et al. |
| 2006/0145304 A1 | 7/2006 | Boyanov et al. |
| 2006/0189133 A1 | 8/2006 | Dimitrakopoulos et al. |
| 2006/0216839 A1 | 9/2006 | Shenesh et al. |
| 2006/0220251 A1 | 10/2006 | Kloster |
| 2006/0246672 A1 | 11/2006 | Chen et al. |
| 2006/0260538 A1 | 11/2006 | Ye et al. |
| 2006/0265868 A1 | 11/2006 | Rueger et al. |
| 2006/0269693 A1 | 11/2006 | Balseanu et al. |
| 2007/0015355 A1 | 1/2007 | Lin et al. |
| 2007/0020940 A1 | 1/2007 | Ohmi et al. |
| 2007/0032024 A1 | 2/2007 | Peidous et al. |
| 2007/0034159 A1 | 2/2007 | Komino et al. |
| 2007/0042581 A1 | 2/2007 | Sano et al. |
| 2007/0054504 A1 | 3/2007 | Chen et al. |

(56) References Cited

U.S. PATENT DOCUMENTS

| | | |
|---|---|---|
| 2007/0065578 A1 | 3/2007 | McDougall et al. |
| 2007/0105292 A1 | 5/2007 | Chen et al. |
| 2007/0132054 A1 | 6/2007 | Arghavani et al. |
| 2007/0134821 A1 | 6/2007 | Thakur et al. |
| 2007/0134907 A1 | 6/2007 | Ikeda et al. |
| 2007/0161230 A1 | 7/2007 | Chen et al. |
| 2007/0189961 A1 | 8/2007 | Iacopi et al. |
| 2007/0196011 A1 | 8/2007 | Cox et al. |
| 2007/0196972 A1 | 8/2007 | Shima |
| 2007/0207624 A1 | 9/2007 | Chua |
| 2007/0215377 A1 | 9/2007 | Aoki |
| 2007/0222081 A1 | 9/2007 | Chen et al. |
| 2007/0224824 A1 | 9/2007 | Chen et al. |
| 2007/0228570 A1 | 10/2007 | Dimitrakopoulos et al. |
| 2007/0254204 A1 | 11/2007 | Shin et al. |
| 2007/0275569 A1 | 11/2007 | Moghadam et al. |
| 2007/0281497 A1 | 12/2007 | Liu et al. |
| 2007/0287240 A1 | 12/2007 | Chen et al. |
| 2008/0009141 A1 | 1/2008 | Dubois et al. |
| 2008/0020591 A1 | 1/2008 | Balseanu et al. |
| 2008/0026579 A1 | 1/2008 | Lai et al. |
| 2008/0053615 A1 | 3/2008 | Sago et al. |
| 2008/0132055 A1 | 6/2008 | Nguyen et al. |
| 2008/0199977 A1 | 8/2008 | Weigel et al. |
| 2008/0242118 A1 | 10/2008 | Dimitrakopoulos et al. |
| 2008/0254643 A1 | 10/2008 | Clevenger et al. |
| 2008/0286697 A1 | 11/2008 | Verhaverbeke et al. |
| 2008/0305600 A1 | 12/2008 | Liao et al. |
| 2008/0318437 A1 | 12/2008 | Kim et al. |
| 2008/0318438 A1 | 12/2008 | Nakamura et al. |
| 2009/0017640 A1 | 1/2009 | Huh et al. |
| 2009/0039475 A1 | 2/2009 | Shioya |
| 2009/0059406 A1 | 3/2009 | Powers et al. |
| 2009/0207624 A1 | 8/2009 | Ma et al. |
| 2009/0243001 A1 | 10/2009 | Ramkumar et al. |
| 2009/0278116 A1 | 11/2009 | Yamate |
| 2010/0018460 A1 | 1/2010 | Singh et al. |
| 2010/0216303 A1 | 8/2010 | Ohkura |
| 2010/0261349 A1 | 10/2010 | Van Schravendijk et al. |
| 2010/0267231 A1 | 10/2010 | Van Schravendijk et al. |
| 2010/0317198 A1 | 12/2010 | Antonelli et al. |
| 2011/0045610 A1 | 2/2011 | Van Schravendijk et al. |
| 2011/0111533 A1 | 5/2011 | Varadarajan et al. |
| 2011/0117678 A1 | 5/2011 | Varadarajan et al. |
| 2011/0236593 A1 | 9/2011 | Okino et al. |
| 2012/0061718 A1 | 3/2012 | Yamazaki et al. |
| 2014/0080324 A1 | 3/2014 | Shrinivasan et al. |
| 2014/0094038 A1 | 4/2014 | Haverkamp et al. |

FOREIGN PATENT DOCUMENTS

| | | |
|---|---|---|
| CN | 101005023 A | 7/2007 |
| CN | 102074500 | 5/2011 |
| JP | 62-229833 | 10/1987 |
| JP | 62229833 A | 10/1987 |
| JP | 63-307740 | 12/1988 |
| JP | 1-107519 | 4/1989 |
| JP | 01-107519 | 4/1989 |
| JP | 05-031735 A | 2/1993 |
| JP | 05-138658 A | 6/1993 |
| JP | 09-306892 | 11/1997 |
| JP | 11214364 A | 8/1999 |
| JP | 2001-104776 A | 4/2001 |
| JP | 2006165573 | 6/2006 |
| JP | 2007-508691 | 4/2007 |
| JP | 2007-194582 A | 8/2007 |
| JP | 2010-103151 | 6/2010 |
| KR | 2000-0043888 | 7/2000 |
| KR | 10-1201039 | 11/2012 |
| TW | 201130045 | 9/2011 |
| TW | 201237959 | 9/2012 |
| WO | 2006/104583 | 10/2006 |
| WO | 2006/127463 | 11/2006 |
| WO | 2007/043206 | 4/2007 |
| WO | WO 2008/156608 | 12/2008 |
| WO | WO 2012/087620 | 6/2012 |

OTHER PUBLICATIONS

Yung et al., "Spin-on Mesoporous Silica Films with Ultralow Dielectric Constants, Ordered Pore Structures, and Hydrophobic Surfaces," Adv. Mater. 2001, 13, No. 14, 1099-1102.

Schulberg et al., "System for Deposition of Mesoporous Materials," U.S. Appl. No. 10/295,965, filed Nov. 15, 2002, 64 Pages.

Watkins et al., "Mesoporous Materials and Methods," U.S. Appl. No. 10/301,013, filed Nov. 21, 2002, 34 Pages.

Justin F. Gaynor, "In-Situ Treatment of Low-K Films With a Silylating Agent After Exposure to Oxidizing Environments," U.S. Appl. No. 10/056,926, filed Jan. 24, 2002, 34 Pages.

Jan, C.H., et al, *90NM Generation, 300mm Wafer Low k ILD/Cu Interconnect Technology*, 2003 IEEE Interconnect Technology Conference.

Gangpadhyay et al., "The First International Surface Cleaning Workshop," Northeastern University, Nov. 11-14, 2002.

Wu et al., "Method and Apparatus of UV Exposure of Low Dielectric Constant Materials for Porogen Removal and Improved Mechanical Properties", Novellus Systems, Inc., U.S. Appl. No. 10/807,680, filed Mar. 23, 2004, pp. 1-34.

U.S. Office Action mailed Sep. 7, 2004, from U.S. Appl. No. 10/672,311.

U.S. Office Action mailed Dec. 28, 2004, from U.S. Appl. No. 10/672,311.

Peter Singer, "New Materials and Designs to Improve Transistor Performance", Apr. 1, 2004, Semiconductor International.

Ghani et al, "A 90nm High Volume Manufacturing Logic Technology Featuring Novel 45nm Gate Length Strained Silicon CMOS Transistors", IEEE, © 2003.

Bhadri N. Varadarajan, "Tensile Silicon Nitride—P1264 NESL", C & F Study, Aug. 21, 2003.

U.S. Office Action mailed Mar. 2, 2005, from U.S. Appl. No. 10/860,340.

U.S. Final Office Action mailed Jun. 13, 2005, from U.S. Appl. No. 10/860,340.

Varadarajan et al., "Tensile Dielectric Films Using UV Curing", U.S. Appl. No. 10/972,084, filed Oct. 22, 2004.

Draeger et al., "Creation of Porosity in Low-K Films by Photo-Disassociation of Imbedded Nanoparticles," U.S. Appl. No. 11/146,456, filed Jun. 6, 2005.

Cho et al., "Methods of Improving Porogen Removal and Film Mechanical Strength in Producing Ultra Low-K Carbon Doped Oxide Films Using Radical Photopolymerization", U.S. Appl. No. 10/982,654, filed Nov. 5, 2004.

U.S. Final Office Action mailed Jul. 13, 2005, from U.S. Appl. No. 10/672,311.

U.S. Office Action mailed Dec. 20, 2005, from U.S. Appl. No. 10/672,311.

U.S. Office Action mailed Mar. 29, 2006, from U.S. Appl. No. 10/800,377.

Kelman et al., "Method for Reducing Stress in Porous Dielectric Films", U.S. Appl. No. 11/369,311, filed Mar. 6, 2006.

U.S. Office Action mailed Jun. 28, 2006, from U.S. Appl. No. 10/825,888.

U.S. Office Action mailed Dec. 27, 2006, from U.S. Appl. No. 10/825,888.

Cho et al., "Method and Apparatus for UV Exposure of Low Dielectric Constant Materials for Porogen Removal and Improved Mechanical Properties", Novellus Systems, Inc., U.S. Appl. No. 11/656,661, filed Jan. 22, 2007, pp. 1-28.

Shrinivasan et al., "Single-Chamber Sequential Curing of Semiconductor Wafers," Novellus Systems, Inc., U.S. Appl. No. 11/115,576, filed Apr. 26, 2005, pp. 1-29.

Schravendijk et al., "UV Treatment of Etch Stop and Hard Mask Films for Selectivity and Hermeticity Enhancement," Novellus Systems, Inc., U.S. Appl. No. 11/696,102, filed Apr. 3, 2007, pp. 1-22.

(56) References Cited

OTHER PUBLICATIONS

Vancouver et al., "PECVD Methods for Producing Ultra Low-K Dielectric Films Using UV Treatment," U.S. Appl. No. 11/608,056, filed Dec. 7, 2006, pp. 1-34.
Tarafdar et al., "Sequential Deposition/Anneal Film Densification Method", Novellus Systems, Inc., filed Sep. 11, 2006, U.S. Appl. No. 11/519,445.
Schravendijk, "UV Treatment of FSG Films to Improve Film Stability," Novellus Systems, Inc., U.S. Appl. No. 11/622,423, filed Jan. 11, 2007, pp. 1-31.
Schravendijk, et al., "UV Treatment of STI Films for Stress," Novellus Systems, Inc., U.S. Appl. No. 11/811,048, filed Jun. 7, 2007.
Arghavani et al., Strain Engineering in Non-Volatile Memories, *Reed Business Information*, 2007, six pages.
Notice of Allowance and Fee Due mailed May 22, 2006, from U.S. Appl. No. 10/672,311.
Allowed Claims from U.S. Appl. No. 10/672,311.
Notice of Allowance and Fee Due mailed Apr. 4, 2007, from U.S. Appl. No. 10/825,888.
Allowed Claims from U.S. Appl. No. 10/825,888.
Bandyopadhyay et al., "Method to Improve Mechanical Strength of Low-K Dielectric Film Using Modulated UV Exposure," Novellus Systems, Inc., U.S. Appl. No. 11/824,049, filed Jun. 28, 2007.
Notice of Allowance and Fee Due mailed Oct. 10, 2006, from U.S. Appl. No. 10/800,377.
Allowed Claims from U.S. Appl. No. 10/800,377.
U.S. Office Action mailed Nov. 28, 2007, from U.S. Appl. No. 10/807,680.
R.J. Lewis, Sr., Hawley's Condensed Chemical Dictionary, 12th Edition, Van Nostrad Reinhold Co., New York, 1993 (no month), excerpts pp. 916-918 & 1123-1124.
Notice of Allowance and Fee Due mailed Dec. 20, 2005, from U.S. Appl. No. 10/860,340.
Allowed Claims from U.S. Appl. No. 10/860,340.
U.S. Office Action mailed Dec. 12, 2007, from U.S. Appl. No. 11/146,456.
U.S. Office Action mailed Oct. 3, 2007, from U.S. Appl. No. 11/115,576.
Shaviv et al., "UV Treatment to Improve Integrity and Performance of Front End Dielectrics," Novellus Systems, Inc., U.S. Appl. No. 11/622,409, filed Jan. 11, 2007.
van Schravendijk et al., "UV Treatment for Carbon-Containing Low-K Dielectric Repair in Semiconductor Processing," Novellus Systems, Inc., U.S. Appl. No. 11/590,661, filed Oct. 30, 2006.
Shrinivassan et al., "Multi-Station Sequential Curing of Dielectric Films," Novellus Systems, Inc., U.S. Appl. No. 11/688,695, filed Mar. 20, 2007.
Varadarajan et al., "A Cascaded Cure Approach to Fabricate Highly Tensile Silicon Nitride Films," Novellus Systems, Inc., U.S. Appl. No. 11/897,838, filed Aug. 31, 2007.
Van den Hoek, et al., "VLSI Fabrication Processes for Introducing Pores Into Dielectric Materials," Novellus Systems, Inc., U.S. Appl. No. 11/606,340, filed Nov. 28, 2006.
U.S. Office Action mailed Jan. 10, 2008, from U.S. Appl. No. 11/622,423.
Bhadri Varadarajan et al., "Development of High Stress SiN Films for Use with Strained Silicon Technologies"; Proc. 68th Symp. on Semiconductors and IC Tech.; Kyoto 2005.
U.S. Office Action mailed Apr. 3, 2008, from U.S. Appl. No. 10/982,654.
U.S. Office Action mailed Sep. 19, 2008, from U.S. Appl. No. 11/824,049.
U.S. Final Office Action mailed Jul. 10, 2008, from U.S. Appl. No. 10/807,680.
U.S. Final Office Action mailed Jul. 25, 2008, from U.S. Appl. No. 11/146,456.
U.S. Final Office Action mailed Jul. 9, 2008, from U.S. Appl. No. 10/982,654.
U.S. Office Action mailed May 14, 2008, from U.S. Appl. No. 11/519,445.

U.S. Final Office Action mailed May 2, 2008, from U.S. Appl. No. 11/115,576.
U.S. Office Action mailed Oct. 17, 2008, from U.S. Appl. No. 11/115,576.
U.S. Office Action mailed Jul. 23, 2008, from U.S. Appl. No. 11/622,423.
U.S. Appl. No. 11/590,661, Office Action mailed Apr. 6, 2009.
U.S. Appl. No. 11/811,048, Office Action mailed Mar. 19, 2009.
Rodriquez, J.A. et al., "Evolution of the mechanical stress on PECVD silicon oxide films under thermal processing", Journal of Materials Science Letters 19, 2000, pp. 1399-1401.
U.S. Appl. No. 11/606,340, Office Action mailed Feb. 5, 2009.
U.S. Appl. No. 11/824,049, Office Action mailed Mar. 19, 2009.
U.S. Appl. No. 10/982,654, Office Action mailed Dec. 4, 2008.
U.S. Appl. No. 11/519,445, Office Action mailed Dec. 10, 2008.
U.S. Appl. No. 10/972,084, Office Action mailed Dec. 30, 2008.
U.S. Appl. No. 11/688,695, Office Action mailed Jun. 11, 2009.
Banthia et al., Strain Engineering in Non-Volatile Memories, *Reed Business Information*, 2007, six pages.
U.S. Appl. No. 11/391,134, *Purging of Porogen from UV Cure Chamber*, filed Mar. 2006.
U.S. Appl. No. 11/696,102, Office Action mailed Jul. 1, 2009.
Yu, J.J. et al., "UV Annealing of Ultrathin Tantalum Oxide Films", Applied Surface Science, V 186 (2002), 57-63.
U.S. Appl. No. 11/369,311, Office Action mailed Aug. 20, 2009.
U.S. Appl. No. 11/608,056, Office Action mailed Aug. 20, 2009.
P. Morin et al., "Tensile contact etch stop layer for nMOS performance enhancement: influence of the film morphology", ECS meeting, May 2005.
Takagi et al., "High Rate Deposition of a-Si:H and a-SiN$_x$:H by VHF PECVD", Vacuum, 51, 1998.
Smith, D.L et al., "Mechanism of SiN$_3$—SiH$_4$ Llasma", J. Electrochem. Soc., vol. 137 (2) 1990.
Nagayoshi et al., "Residual Stress of a Si$_{1-x}$N$_x$: H Films Prepared by Afterglow Plasma Chemical Vapor Deposition Technique", Jpn. J. Appl. Phys. vol. 31 (1992) pp. L867-L869 Part 2, No. 7A, Jul. 1, 1992.
Varadarajan et al., "Use of VHF RF plasma to deposit high tensile stress films with improved film properties for use in strained silicon technology", U.S. Appl. No. 11/975,473, filed Oct. 18, 2007.
U.S. Appl. No. 11/975,473, Office Action mailed Oct. 28, 2008.
U.S. Appl. No. 11/975,473, Office Action mailed Mar. 23, 2009.
Jiang et al., "Tensile dielectric films using UV curing", U.S. Appl. No. 11/899,683, filed Sep. 7, 2007.
U.S. Appl. No. 11/899,683, Office Action mailed May 29, 2009.
U.S. Appl. No. 11/519,445, Office Action mailed Aug. 26, 2009.
U.S. Appl. No. 11/622,409, Office Action mailed Jul. 1, 2009.
Haverkamp et al , "Enhancing adhesion of cap layer films", U.S. Appl. No. 11/731,581, filed Mar. 30, 2007.
U.S. Appl. No. 11/731,581, Office Action mailed Jun. 1, 2009.
U.S. Appl. No. 11/975,473, Office Action mailed Oct. 9, 2009.
Bandyopadhyay et al., "Method to Improve Mechanical Strength of Low-K Dielectric Film Using Modulated UV Exposure," Novellus Systems, Inc., U.S. Appl. No. 12/566,514, filed Sep. 24, 2009.
U.S. Appl. No. 11/622,409, Office Action mailed Nov. 5, 2009.
U.S. Appl. No. 11/519,445, Office Action mailed Nov. 4, 2009.
U.S. Appl. No. 10/972,084, Office Action mailed Nov. 27, 2009.
Haverkamp, et al., "Progressive UV Cure," Novellus Systems, Inc., U.S. Appl. No. 12/210,060, filed Sep. 12, 2008.
U.S. Appl. No. 11/696,102, Final Office Action mailed Dec. 22, 2009.
U.S. Appl. No. 11/369,311, Office Action mailed Jan. 5, 2010.
U.S. Appl. No. 11/688,695, Final Office Action mailed Dec. 31, 2009.
U.S. Appl. No. 11/590,661, Final Office Action mailed Jan. 25, 2010.
U.S. Appl. No. 11/656,661, Office Action mailed Jan. 22, 2010.
U.S. Appl. No. 11/731,581, Final Office Action mailed Feb. 4, 2010.
U.S. Appl. No. 11/899,683, Office Action mailed Feb. 8, 2010.
Wu, et al., "Methods for Fabricating Zeolite Nano-Crystal Based Low-K Dielectric Films Containing Si (CxHy)n. Groups and Treating Films by Ultra-Violet Thermal Processing," Novellus Systems, Inc., U.S. Appl. No. 12/172,089, filed Jul. 11, 2008.
Chaabouni, H. et al., "Porous SiOCH Ultra Low-K recovery treatments after direct CMP process", Advanced Metallization Conference, Sep. 2008.

(56) References Cited

OTHER PUBLICATIONS

Chaabouni, H. et al., "Sidewall restoration of porous ultra low-$k$ dielectrics for sub-45 nm technology nodes", Microelectronic Engineering 84 (2007).
Huang, H. et al., "O2 Plasma Damage and Dielectric Recoveries to Patterned CDO Low-k Dielectrics", Advanced Metallization Conference, Sep. 2008.
U.S. Appl. No. 11/608,056, Office Action mailed Mar. 23, 2010.
U.S. Appl. No. 11/975,473, Office Action mailed Mar. 25, 2010.
Takagi et al., "High Rate Deposition of a-SiNx:H by VHF PECVD", Mat. Res. Soc. Symp. Proc. vol. 467, 1997, Materials Research Society.
U.S. Appl. No. 12/726,263, "Apparatus for UV damage repair of low K films prior to copper barrier deposition", van Schravendijk et al., filed Mar. 17, 2010.
U.S. Appl. No. 11/519,445, Notice of Allowance mailed Apr. 21, 2010.
U.S. Appl. No. 11/519,445, Allowed Claims.
U.S. Appl. No. 12/646,830, "UV and Reducing Treatment for K Recovery and Surface Clean in Semiconductor Processing", Varadarajan, Bhadri et al., filed Dec. 23, 2009.
U.S. Appl. No. 12/840,192, "Sequential deposition / anneal film densification method", Tarafdar et al., filed Jul. 20, 2010.
U.S. Appl. No. 11/688,695, Office Action mailed Jul. 23, 2010.
U.S. Appl. No. 11/590,661, Notice of Allowance mailed Aug. 6, 2010.
U.S. Appl. No. 11/590,661, Allowed Claims.
U.S. Appl. No. 11/602,564, "Method of Eliminating Small Bin Defects in High Throughput TEOS Films", Henri et al., filed Nov. 20, 2006.
U.S. Appl. No. 12/001,348, "Tunable-Illumination Reflector Optics for UV Cure System", Bryan Bolt, filed Dec. 10, 2007.
U.S. Appl. No. 12/008,149, "Measuring in-situ UV intensity in UV cure tool", Eugene Smargiassi, filed Jan. 8, 2008.
U.S. Appl. No. 10/975,028, Office Action mailed Oct. 6, 2005.
U.S. Appl. No. 10/975,028, Office Action mailed Mar. 24, 2006.
U.S. Appl. No. 10/975,028, Notice of Allowance mailed May 8, 2006.
U.S. Appl. No. 11/811,048, Notice of Allowance mailed Aug. 17, 2009.
U.S. Appl. No. 11/811,048, Notice of Allowance mailed Oct. 8, 2009.
U.S. Appl. No. 11/824,049, Notice of Allowance mailed Jun. 22, 2009.
U.S. Appl. No. 11/656,661, Final Office Action mailed Aug. 24, 2010.
U.S. Appl. No. 12/172,089, Office Action mailed Sep. 13, 2010.
Li, Shuang et al., "Organic-functionalized pure-silica-zeolite MFI low-$k$ films", Chem. Mater. 2005, 17, Mar. 9, 2005, pp. 1851-1854.
U.S. Appl. No. 11/731,581, Final Office Action mailed Sep. 2, 2010.
U.S. Appl. No. 10/972,084, Office Action mailed Oct. 15, 2010.
U.S. Appl. No. 11/975,473, Office Action mailed Nov. 1, 2010.
U.S. Appl. No. 11/608,056, Notice of Allowance mailed Nov. 2, 2010.
U.S. Appl. No. 11/608,056, Allowed Claims.
U.S. Appl. No. 12/566,514, Office Action mailed Jan. 11, 2011.
U.S. Appl. No. 11/696,102, Office Action mailed Jan. 26, 2011.
U.S. Appl. No. 11/688,695, Office Action mailed Feb. 1, 2011.
U.S. Appl. No. 11/146,456, Notice of Allowance mailed Nov. 10, 2008.
U.S. Appl. No. 11/146,456, Supplemental Notice of Allowance mailed Dec. 15, 2008.
Draeger et al., "Creation of Porosity in Low-K Films by Photo-Disassociation of Imbedded Nanoparticles," U.S. Appl. No. 12/369,384, filed Feb. 11, 2009.
U.S. Office Action mailed Feb. 22, 2011, from U.S. Appl. No. 12/369,384.
U.S. Appl. No. 11/369,311, Office Action mailed Apr. 13, 2011.
U.S. Appl. No. 12/172,089, Final Office Action mailed Apr. 14, 2011.
U.S. Appl. No. 10/972,084, Office Action mailed May 2, 2011.
U.S. Appl. No. 11/656,661, Office Action mailed May 19, 2011.
U.S. Appl. No. 11/731,581, Office Action mailed Jun. 2, 2011.
U.S. Appl. No. 12/646,830, "UV and reducing treatment for K recovery and surface clean in semiconductor processing," Varadarajan et al., filed Dec. 23, 2009.
U.S. Appl. No. 11/897,838, Office Action mailed Jul. 11, 2011.
U.S. Appl. No. 12/646,830, Office Action mailed Jul. 15, 2011.
Notice of Allowance for U.S. Appl. No. 12/566,514, mailed Jul. 13, 2011.
Allowed Claims as of Jul. 13, 2011 for U.S. Appl. No. 12/566,514.
U.S. Appl. No. 11/696,102, Final Office Action mailed Aug. 11, 2011.
Notice of Allowance for U.S. Appl. No. 12/369,384, mailed Aug. 19, 2011.
Allowed Claims as of Aug. 19, 2011 for U.S. Appl. No. 12/369,384.
Korean Notification of Provisional Rejection mailed Dated Jul. 12, 2011 for Application No. 10-2010-0066153.
U.S. Appl. No. 11/369,311, Final Office Action mailed Sep. 29, 2011.
U.S. Appl. No. 11/115,576, "Single-Chamber Sequential Curing of Semiconductor Wafers," Shrinivasan et al., filed Apr. 26, 2005.
U.S. Appl. No. 11/115,576, Office Action mailed Oct. 3, 2007.
U.S. Appl. No. 11/115,576, Office Action mailed May 2, 2008.
U.S. Appl. No. 11/115,576, Office Action mailed Oct. 17, 2008.
U.S. Appl. No. 11/115,576, Office Action mailed Apr. 22, 2009.
U.S. Appl. No. 11/115,576, Office Action mailed Oct. 1, 2009.
U.S. Appl. No. 11/602,564, "Method of Eliminating Small Bin Defects in High Throughput TEOS Films," Henri et al., filed Nov. 20, 2006.
U.S. Appl. No. 11/602,564, Office Action mailed Feb. 15, 2008.
U.S. Appl. No. 11/602,564, Office Action mailed Sep. 4, 2008.
U.S. Appl. No. 11/602,564, Office Action mailed Mar. 20, 2009.
U.S. Appl. No. 12/001,348, "Tunable-Illumination Reflector Optics for UV Cure System," Bryan Bolt, filed Dec. 10, 2007.
U.S. Appl. No. 12/008,149, "Measuring in-situ UV intensity in UV cure tool," Eugene Smargiassi, filed Jan. 8, 2008.
U.S. Appl. No. 12/008,149, Office Action mailed Mar. 17, 2010.
U.S. Appl. No. 11/115,576, Office Action mailed Apr. 15, 2010.
U.S. Appl. No. 11/115,576, Office Action mailed Oct. 1, 2010.
U.S. Appl. No. 12/008,149, Notice of Allowance mailed Nov. 19, 2010.
U.S. Appl. No. 11/115,576, Office Action mailed May 9, 2011.
U.S. Appl. No. 12/001,348, Office Action mailed May 20, 2011.
U.S. Appl. No. 13/070,306, "Measuring in-situ UV intensity in UV cure tool," Eugene Smargiassi, filed Mar. 23, 2011.
U.S. Appl. No. 12/973,549, Office Action mailed Oct. 11, 2011.
U.S. Appl. No. 10/972,084, Office Action mailed Oct. 27, 2011.
U.S. Appl. No. 11/656,661, Final Office Action mailed Nov. 10, 2011.
U.S. Appl. No. 12/940,324, Office Action mailed Dec. 13, 2011.
U.S. Appl. No. 11/731,581, Office Action mailed Nov. 28, 2011.
U.S. Appl. No. 11/115,576, Notice of Allowance mailed Nov. 14, 2011.
U.S. Appl. No. 12/210,060, Office Action mailed Nov. 28, 2011.
U.S. Appl. No. 12/646,830, Office Action mailed Jan. 11, 2012.
U.S. Appl. No. 11/688,695, Office Action mailed Dec. 14, 2011.
Kamian et al., "Ultra Violet Light Treatment Load Lock for Dielectric Films," Novellus Systems, Inc., U.S. Appl. No. 11/561,834, filed Nov. 20, 2006, pp. 1-25.
U.S. Appl. No. 11/561,834, Office Action mailed May 21, 2010.
Gytri et al., "Methods and Apparatuses for Reducing Porogen Accumulation from a UV-Cure Chamber," Novellus Systems, Inc., U.S. Appl. No. 12/132,559, filed Jun. 3, 2008.
U.S. Appl. No. 12/132,559, Office Action mailed Nov. 19, 2010.
U.S. Appl. No. 12/132,559, Final Office Action mailed Jun. 9, 2011.
U.S. Appl. No. 11/561,834, Final Office Action mailed Dec. 3, 2010.
U.S. Appl. No. 12/001,348, Office Action mailed Nov. 25, 2011.
U.S. Appl. No. 12/132,559, Office Action mailed Nov. 22, 2011.
Shrinivassan et al., "Multi-Station Sequential Curing of Dielectric Films," U.S. Appl. No. 14/086,732, filed Nov. 21, 2013.
Varadarajan et al., "A Cascaded Cure Approach to Fabricate Highly Tensile Silicon Nitride Films," Novellus Systems, Inc., U.S. Appl. No. 13/487,051, filed Jun. 1, 2012.
US Office Action (Supplemental), dated Jan. 10, 2006, issued in U.S. Appl. No. 10/672,311.

(56) References Cited

OTHER PUBLICATIONS

U.S. Office Action dated Mar. 12, 2012 issued in U.S. Appl. No. 13/275,209.
U.S. Final Office Action dated Aug. 15, 2012 issued in U.S. Appl. No. 13/275,209.
U.S. Office Action dated Jul. 25, 2013 issued in U.S. Appl. No. 13/275,209.
U.S. Notice of Allowance dated Jan. 9, 2014 issued in U.S. Appl. No. 13/275,209.
U.S. Office Action dated Jul. 19, 2012 issued in U.S. Appl. No. 11/656,661.
U.S. Final Office Action dated Jan. 30, 2013 issued in U.S. Appl. No. 11/656,661.
U.S. Notice of Allowance dated May 3, 2010 issued in U.S. Appl. No. 11/519,445.
U.S. Office Action dated Feb. 6, 2012 issued in U.S. Appl. No. 12/840,192.
U.S. Final Office Action dated Jul. 19, 2012 issued in U.S. Appl. No. 12/840,192.
U.S. Notice of Allowance dated Sep. 20, 2012 issued in U.S. Appl. No. 12/840,192.
U.S. Office Action dated Mar. 15, 2013 issued in U.S. Appl. No. 12/840,192.
U.S. Final Office Action dated May 1, 2012 issued in U.S. Appl. No. 10/972,084.
U.S. Office Action dated Oct. 5, 2012 issued in U.S. Appl. No. 10/972,084.
U.S. Final Office Action dated May 22, 2013 issued in U.S. Appl. No. 10/972,084.
U.S. Final Office Action dated Aug. 8, 2013 issued in U.S. Appl. No. 10/972,084.
U.S. Examiner's Answer to Appeal Brief (filed Nov. 20, 2013) Before the Patent Trial and Appeal Board on Mar. 13, 2014 issued in U.S. Appl. No. 10/972,084.
U.S. 2nd or Subsequent Examiner's Answer to Appeal Brief (filed Nov. 20, 2013) Before the Patent Trial and Appeal Board on Apr. 2, 2014 issued in U.S. Appl. No. 10/972,084.
U.S. Office Action dated Mar. 7, 2012 issued in U.S. Appl. No. 11/369,311.
U.S. Final Office Action dated Jul. 31, 2012 issued in U.S. Appl. No. 11/369,311.
U.S. Office Action dated Jun. 11, 2013 issued in U.S. Appl. No. 11/369,311.
U.S. Final Office Action dated Oct. 25, 2013 issued in U.S. Appl. No. 11/369,311.
U.S. Office Action dated Mar. 17, 2014 issued in U.S. Appl. No. 11/369,311.
U.S. Notice of Allowance dated Feb. 24, 2012 issued in U.S. Appl. No. 11/696,102.
U.S. Final Office Action dated Jun. 21, 2012 issued in U.S. Appl. No. 11/688,695.
U.S. Notice of Allowance dated Oct. 4, 2012 issued in U.S. Appl. No. 11/688,695.
U.S. Notice of Allowance dated Feb. 14, 2013 issued in U.S. Appl. No. 11/688,695.
U.S. Office Action dated Jul. 19, 2013 issued in U.S. Appl. No. 13/886,694.
U.S. Notice of Allowance dated Sep. 12, 2013 issued in U.S. Appl. No. 13/886,694.
U.S. Office Action dated Aug. 28, 2012 issued in U.S. Appl. No. 11/731,581.
U.S. Final Office Action dated Jun. 14, 2013 issued in U.S. Appl. No. 11/731,581.
U.S. Office Action dated Mar. 31, 2014 issued in U.S. Appl. No. 14/026,894.
U.S. Office Action dated May 31, 2012 issued in U.S. Appl. No. 12/726,263.
U.S. Final Office Action dated Sep. 10, 2012 issued in U.S. Appl. No. 12/726,263.
U.S. Office Action dated Mar. 6, 2013, issued in U.S. Appl. No. 12/726,263.
U.S. Final Office Action, dated Aug. 7, 2013, issued in U.S. Appl. No. 12/726,263.
U.S. Notice of Allowance dated Mar. 2, 2012 issued in U.S. Appl. No. 11/897,838.
U.S. Office Action, dated Jan. 3, 2013, issued in U.S. Appl. No. 13/487,051.
U.S. Notice of Allowance, dated Apr. 22, 2013, issued in U.S. Appl. No. 13/487,051.
U.S. Final Office Action dated Oct. 3, 2012, issued in U.S. Appl. No. 12/210,060.
U.S. Office Action dated Apr. 24, 2014 issued in U.S. Appl. No. 12/210,060.
U.S. Final Office Action dated May 25, 2012 issued in U.S. Appl. No. 12/646,830.
U.S. Office Action dated Mar. 6, 2013 issued in U.S. Appl. No. 12/646,830.
U.S. Final Office Action dated Jul. 30, 2013 issued in U.S. Appl. No. 12/646,830.
U.S. Office Action dated Feb. 20, 2014 issued in U.S. Appl. No. 12/646,830.
U.S. Office Action dated Jun. 7, 2012 issued in U.S. Appl. No. 12/973,549.
U.S. Office Action dated Jan. 3, 2013 issued in U.S. Appl. No. 12/973,549.
U.S. Notice of Allowance dated Feb. 22, 2013 issued in U.S. Appl. No. 12/973,549.
Chinese Office Action dated Jan. 14, 2013 issued in Appl. No. 201010539625.7.
Chinese Second Office Action dated Sep. 10, 2013 issued in Appl. No. 201010539625.7.
Chinese Third Office Action dated May 23, 2013 issued in Appl. No. 201010539625.7.
Korean Notification of Provisional Rejection dated Mar. 26, 2012 issued in Appl. No. 10-2010-0066153.
SG Examination Report dated Apr. 25, 2012 issued in Application No. 2010079747.
Taiwan Office Action dated Mar. 27, 2013 issued in Application No. 099123184.
PCT International Search Report and Written Opinion dated Dec. 26, 2012, issued in PCT/US2011/064246.
PCT International Preliminary Report on Patentability and Written Opinion dated Jul. 4, 2013, issued in PCT/US2011/064246.
Korean Office Action dated Sep. 26, 2013, issued in KR 2013-7019282.
Korean Second Office Action dated Dec. 5, 2013, issued in KR 2013-7019282.
Taiwan Search Report dated Aug. 20, 2013 issued in TW 100147212.
Deshmukh, et al., (Mar./Apr. 1993) "Remote Plasma Etching Reactors: Modeling and Experiment," *J. Vac. Sci. Technol.*, B 11(2):206-215.
U.S. Final Office Action dated Dec. 5, 2014 issued in U.S. Appl. No. 14/026,894.
U.S. Final Office Action dated Nov. 17, 2014, issued in U.S. Appl. No. 12/210,060.

* cited by examiner

MULTI-STATION SEQUENTIAL CURING OF DIELECTRIC FILMS

CROSS-REFERENCE TO RELATED APPLICATIONS

This application is a continuation-in-part claiming priority under 35 USC 120 from U.S. patent application Ser. No. 11/688,695, filed on Mar. 20, 2007, titled "MULTI-STATION SEQUENTIAL CURING OF DIELECTRIC FILMS," which is a continuation-in part of U.S. patent application Ser. No. 11/369,311, filed on Mar. 6, 2006, titled "Method For Reducing Stress In Porous Dielectric Films," which is a continuation-in-part claiming priority under 35 USC 120 from U.S. patent application Ser. No. 11/115,576, filed on Apr. 26, 2005, titled "Single-Chamber Sequential Curing Of Semiconductor Wafers." These applications are incorporated herein by reference in their entirety for all purposes.

FIELD OF THE INVENTION

This invention relates to methods for preparing and treating dielectric films. More specifically, the invention relates to exposing films to ultraviolet radiation and other process conditions to facilitate a desired change in film properties.

BACKGROUND

Many layers of dielectric films are used to make an integrated circuit. IC manufacturing requires dielectric films to have certain properties in order for the circuit to function as designed. For example, there is a general need for materials with low dielectric constants (low-k). Using low-k materials as the intermetal dielectric (i.e., the layer of insulator separating consecutive levels of the conductive metal interconnects) reduces the delay in signal propagation due to capacitive effects, otherwise know as the RC delay. A dielectric material of low dielectric constant will have low capacitance, and hence the RC delay of an IC constructed with such a material will be lower as well.

As another example, there is a general need for materials with specific tensile or compressive stresses. Increasing shallow trench isolation (STI) film tensile stress increases transistor drain current and device performance because the electron and hole mobilities are higher. Other applications require dielectric films to have compressive stress. These and other properties may be met on the film as deposited, or after treatment.

One such treatment may be a thermal process in which the substrate is heated to a temperature for a time. A thermal treatment may remove unwanted particles from the film, or change its stresses and other properties. These thermal processes, however, have certain difficulties. In particular, substrate temperatures generally need to be high (i.e., greater than about 400 degrees Celsius) with exposure times typically on the order of hours. As is well known in the field, these conditions can damage copper containing devices, especially in the application wherein a low-k dielectric is being cured and the long exposure time may be unsuitable for mass manufacturing. Also, the use of temperature sensitive nickel silicide precludes inducing film stress by using temperatures above 400° C. while some SiN films have a cure temperature up to 480° C.

To overcome these disadvantages of thermal processing, another technique has been developed, which involves exposing the film to UV radiation. Irradiation of the low-k or spacer nitride films permits modulation of desired film properties such as dielectric constant or film stress at lower temperatures. However, the use of UV radiation in such processes may result in deleterious side-effects unless special care is taken to deliver the precise wavelengths and to maintain the wafer temperature at an optimal level.

What are needed therefore are improved methods and devices for treating dielectric films with UV radiation to obtain desired film properties.

SUMMARY

The present invention addresses this need by providing improved methods to treat dielectric films with UV radiation. The methods involve multiple operation ultraviolet curing processes in which UV intensity, wafer substrate temperature, UV spectral distribution, and other conditions may be independently modulated in each operation. All operations in the methods may be performed in the same semiconductor processing tool or even the same semiconductor processing chamber. The chamber may have two or more stations. Each station may be configured to perform more than one exposure operation, either serially, concurrently, or partially overlapping. For example, the more than one exposure operation may be operations where the radiation intensity varies, e.g., in a pulsed operation. In another example, radiation having different spectral distributions and different intensities may be irradiated on the same wafer concurrently. These radiation having different characteristics may be emitted from by different radiation sources.

The method also includes flowing gas during the UV radiation exposure. Particularly, helium gas may be flowed to the wafer. In other embodiments, a mixture helium and argon gas may be used. Each operation in the method embodiment may have different gases flowed at different rates. This list is not meant to be exclusive. For instance, other suitable gases may include nitrogen.

The method may be used to repair damaged low-k dielectric films after an etching operation. The method may also be used to remove porogen and cross-link bonds in porous low-k dielectric films. In the porogen removal and cross-linking case, the wafer temperature may be maintained during all exposure operation.

The invention also pertains to a chamber for processing semiconductor wafers. The chamber may include a number of processing stations. Each station may include a wafer support and one or more radiation sources. The chamber may also include a mechanism to transfer a wafer to each station. Each station is operable to provide wafer exposure characteristics that vary in at least one of radiation intensity, radiation wavelength, spectral distribution, and wafer temperature for at least two of the plurality of stations. The radiation sources may include one or more light generators and one or more optical components operable to modify one or more characteristics of the radiant output of the light generators. Thus, radiation output of different radiation sources may have different characteristics as to radiation intensity, radiation wavelength, spectral distribution, and wafer temperature.

In certain embodiments, at least one station in a chamber includes two or more independently operable radiation sources. The independently operable radiation sources may be configured to generate radiation that varies in at least one of radiation intensity, radiation wavelength, and spectral distribution.

In another aspect, the invention also pertains to a semiconductor processing tool. The tool may include one or more processing chambers and a mechanism to transfer a wafer to each chamber. Each chamber may include a wafer support and a radiation source operable to provide wafer exposure characteristics that vary at least one of radiation intensity, radiation wavelength, spectral distribution, and wafer support temperature. In some embodiments, one or more processing chamber is configured to dissociate porogen while minimizing cross-linking in a low-k dielectric film and one or more processing chamber is configured to cross-link bonds in the film.

These and other features and advantages of the invention will be described in more detail below with reference to the associated drawings.

DETAILED DESCRIPTION OF A PREFERRED EMBODIMENT

Introduction

Figure 1:
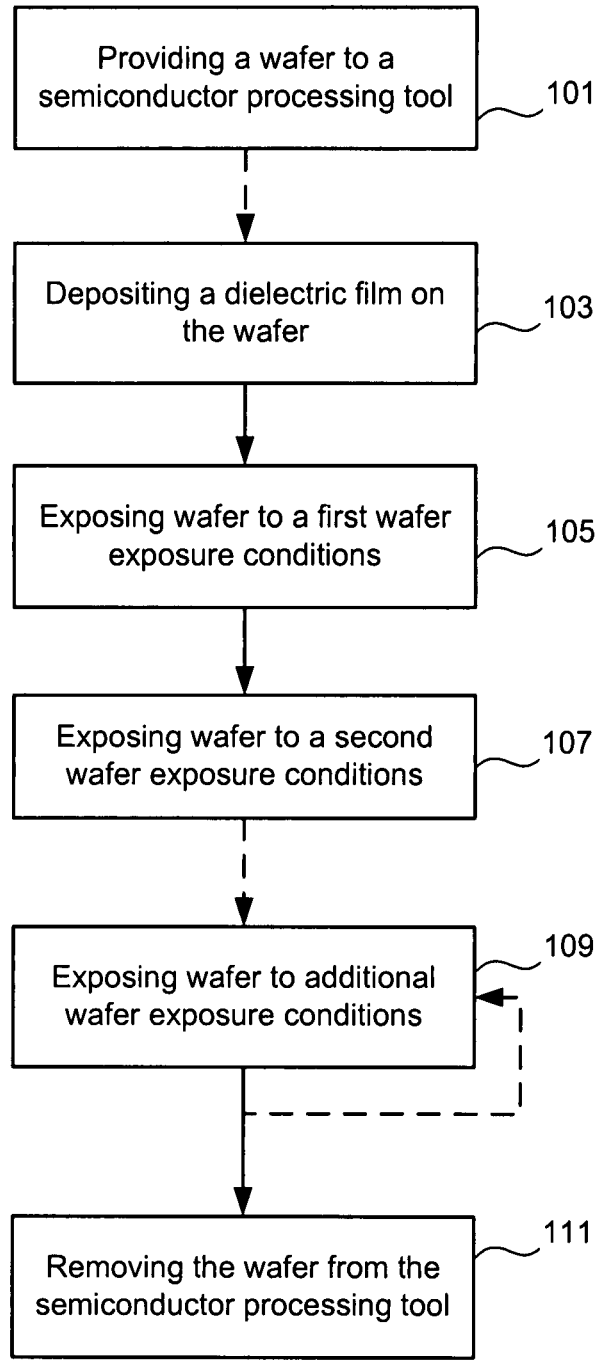
FIG. 1 is a flowchart summarizing stages of a general process in accordance with the present invention.

In the following description, numerous specific details are set forth in order to provide a thorough understanding of the present invention. The present invention may be practiced without some or all of these specific details. In other instances, well known process operations have not been described in detail to not unnecessarily obscure the present invention. While the invention will be described in conjunction with the specific embodiments, it will be understood that it is not intended to limit the invention to the embodiments.

The present invention involves a multi-station semiconductor processing chamber. Each station has a wafer support and a radiation source. The radiation source has one or more light generators and one or more optical components. The radiation intensity and the wavelength output of the radiation source may be independently controlled at each station. The wafer support temperature and gas flow may also be independently controlled at each station. In certain embodiments, the present invention pertains to a multi-chamber semiconductor processing tool having at least one wafer processing station in each chamber and capable of independently control radiation intensity, radiation wavelengths, and wafer temperature at each station.

The present invention also involves processes to prepare and/or cure dielectric films on substrates by exposure to UV radiation. Effects of exposure to UV radiation or UV curing may include increased stress of the materials, increased cross-linking of the bonds of the material and densification the material. UV radiation is also used to remove porogen from a precursor layer containing a porogen and structure former or backbone, thereby forming a porous dielectric film. UV radiation can also be used to evolve solvents present in a film, such as a spin-on ULK film. It is often desirable to modulate one or more of these effects in preference to one another—for example, for dense low-k carbon-doped oxide (CDO) films, it is desirable to increase the mechanical properties of the films by cross-linking without a large increase in the stress of the film whereas for silicon nitride films, a large increase in the stress may be desirable. Similarly, in preparing porous low-k films from precursor layers, it may be desirable to remove porogen from a precursor layer and strengthen the backbone without causing the film thickness to shrink, and thereby causing a concomitant increase in stress. Further, in the case of porous low-k films, it may be desirable to remove the porogen from the film before its cross-linking commences.

Conventional UV curing processes use a single processing condition, e.g. 100% UV intensity and temperature of 400° C., that may be suitable for one or some of the effects listed above but may also cause an undesired effect. For example, porogen evolution and film strengthening occur at slightly different wavelengths. Using a broad spectrum UV radiation, Si—$CH_3$ bonds in the film would cross-link rapidly. As a consequence of this cross-linking the film shrinks and rapidly densifies, trapping porogen in the matrix and preventing its successful evolution. This undesired effect causes the film to have a higher dielectric constant than desired.

Methods of the invention modulate these effects in preference to one another. In certain embodiments, the methods involve multiple operation cure processes, each operation having a particular desired result or effect, with conditions such as UV intensity and substrate temperature optimized for the particular desired result. Also in certain embodiments, optimizing conditions for a desired effect involves independently controlling the UV intensity, UV wavelength range, and the substrate temperature in each operation (i.e., so that the substrate temperature is decoupled from the UV intensity and wavelength). The methods of the invention may be performed in multi-station cure chambers, each station having a UV light source, and conditions at each station optimized for the desired result at that station.

UV curing is used to drive out porogen from composite porogen-CDO films, leaving a porous CDO matrix with a low k-value, generally between 2.0 and 2.6. In a particular embodiment, the methods of the present invention are used to prepare dielectric films from precursor films or layers that contain a structure former that serves as a backbone of a porous network, and a porogen, which generates the porous regions within the porous network. The methods involve a multiple operation UV cure process in which porogen is removed in an initial exposure (or exposures) to UV radiation to form a porous dielectric film. This operation tends to make the film softer. Once the porogen is removed, the film is exposed to UV radiation to increase cross-linking within the film, thereby increasing the hardness. Films produced by these methods have lower stress than films produced using a single cure operation, while having comparable hardness and modulus as those films. The UV exposure characteristics of these operations are different so as to accomplish different effects on the film.

FIG. 1 is a flow chart depicting generic operations in accordance with the present invention. Initially, a wafer is provided to a semiconductor processing tool (101). This wafer may or may not have a film deposited on it that will be the subject of the UV treatment. If the wafer does not include the film to be treated, an optional step would be to deposit such film onto the wafer (103). This deposition may be performed in a separate chamber or in a first station of a multi-station chamber. Based on the type of film to be treated and processing to be achieved, the wafer is then exposed to radiation under a first set of exposure conditions (105). These conditions may be radiation intensity, spectral distribution, radiation wavelength(s) (either a single wavelength may be used or a spectrum or a range of wavelengths), wafer temperature, and gas flow. These conditions may be controlled independently from each other from operation to operation. In a second operation, the wafer is exposed to radiation at a second set of conditions (107). Typically one or more of these conditions will be different from operation to operation, and additional operations may be used to vary one or more of these conditions (109). An operation may include transferring the wafer between stations, so that the same operation is performed at more than one station, but under the same conditions. In some instances, more than one operation may be performed at one station. The more than one operation may be performed serially, such as pulsed UV exposure in two intensities. The more than one operation may also be performed concurrently, such as UV exposure from two light sources having different intensities and spectral distributions. In some cases, one operation may start before another ends such that only a portion of the operations overlaps each other.

An operation covering more than one station may be preferable in some cases to average out any radiation non-uniformity. Because the wafer is flat and circular, a light generator, usually tubular, cannot uniformity irradiate all parts of the wafer. Using optical components, a plurality of light generators, and carefully designing the layout of these generators, the radiation across the wafer can be made more uniform, but not perfectly. By exposing wafers in subsequent stations under the same exposure conditions but in a different relative orientation (between the light source and the wafer), any spots of non-uniformity are changed from station to station. The generators may be laid out and relative orientation changed such that the total exposure from all of the light sources in the various stations is uniform over the wafer. After the irradiation operations, the wafer is removed from the semiconductor tool in operation 111. However, the wafer may experience more processing before it is removed, for example, the wafer may be cooled, or more films may be deposited, before the wafer exits the semiconductor processing tool.

In certain embodiments, the UV cure processes described herein improve wafer throughput by reducing UV exposure time and/or parallel processing of wafers. For example, in one embodiment, having a dedicated porogen removal step reduces required UV exposure time to harden the film by 75% resulting in a three-fold improvement in wafer throughput in the UV cure station. Using of helium solely as the purging gas also reduces cure time. Using a combination of helium and argon, or helium and nitrogen also found to have a beneficial effect to the cure time.

Reference is made throughout the specification to multiple operations in which porogen is removed from a precursor film in an initial operation or operations, and cross-linking (and hardness) is increased in a subsequent operation or operations and for which temperature and UV intensity differentiate the porogen removal and cross-linking operations. As indicated, these processes may be used to produce low stress porous dielectric films having good mechanical strength. However, the multiple operations may also be used for other UV curing processes in which exposure conditions differ from stage to stage to increase any of the effects of UV radiation in preference to any other effect. Some of these UV curing processes include increasing the tensile stress in nitride film at different wafer temperatures and treatment spin-on ULK film to evolve solvent and to harden the film.

Certain embodiments of the present invention involve depositing onto a wafer the film to be irradiated. Different types of film may be deposited, depending on process requirements. One such film is the low-k dielectric film. A precursor film or layer that contains a "structure former", typically a dielectric material, is deposited with a porogen, which generates the porous regions within the dielectric material. In a method of this invention, the porogen is removed from the precursor film to create a porous low-k dielectric layer. Within the precursor film, the porogen resides in locations that will subsequently become void locations in the final dielectric film. Discussion of method of forming the precursor film may be found in U.S. patent application Ser. No. 11/369,311, filed on Mar. 6, 2006, titled "Method For Reducing Stress In Porous Dielectric Films," the disclosure of which is herein incorporated by reference in its entirety for all purposes.

Porogen Removal

The porogen removal operation may be accomplished by thermal anneal, UV radiation, or a combination of both. It will be appreciated by those skilled in the art that the UV radiation used with the invention encompasses near-UV, as well UV wavelengths. Thus, the radiation used to facilitate porogen removal in accordance with this invention may have wavelengths ranging between about 156 and 500 nanometers. As indicated, the UV wavelength(s) should match the absorption characteristics of the porogen bonds to be broken and/or the oxidizing agent, if used. Common bonds to be targeted which contribute to the overall absorption characteristics of the porogen-containing film are Si—$CH_3$, C—C, C═C and C—H. For example, ATRP has an absorption peak at approximately 250-270 nanometers; therefore, a UV source intended to interact directly with a film containing ATRP preferably has high intensity components in the range of about 220 to 285 nanometers. Note that the radiation may comprise a narrow range of wavelengths (e.g., most intensity exits in a band about 1 to 20 nanometers in width) or a broader range of wavelengths.

As indicated, the UV light can directly interact with porogen bonds and thereby facilitate its decomposition or other breakdown mechanism. In a typical case, the porogen decomposes into lower molecular weight components that exist in the vapor phase or can be easily vaporized and thereby removed from the precursor film. Alternatively the UV radiation can indirectly facilitate breakdown of the porogen. In one example, this is accomplished by the UV radiation interacting with a compound other than the porogen to convert that compound into a species that can attack the porogen and thereby facilitate its removal. For example, the UV radiation may convert molecular oxygen or other oxygen containing compounds present in a reaction chamber to produce a strong oxidant, which can then react with and break down the porogen. Again, the decomposition products of the porogen can be volatilized, diffuse out of the film, and be removed from the precursor film.

In embodiments wherein UV radiation is used to remove porogen, one or more of substrate temperature, UV intensity and UV wavelength are set to result in porogen removal while minimizing the increase in the stress of the film. As discussed above, the single conventional cure operation, e.g., at 400° C. and 100% UV intensity, used for porogen removal and cross-linking results in an increase in stress and entrapment of porogen when the surface hardens before all the porogen has evolved. In certain embodiments of this invention, the porogen removal operation is performed at a lower UV intensity and/or lower temperature than subsequent cross-linking operations.

Temperatures during the porogen removal operation may be from around 250° C.-450° C. As indicated, in some embodiments the temperature during the porogen removal operation is lower than the temperature during the cross-linking operation. For example, the wafer temperature during the porogen removal operation may range from about 250° C.-400° C.; in specific embodiments the temperature ranges from about 350° C.-400° C., about 350° C.-375° C., and about 375° C.-400° C. In one particular embodiment, the temperature is about 400° C. during the porogen removal operation.

As discussed below, temperatures during the cross-linking operation may be around 400° C. or greater.

Also in certain embodiments, UV intensity during porogen removal is lower than the intensity during the cross-linking operation. For example, porogen removal UV intensity may be from about 0-60%, 0-70%, 0-80% or 0-90% of the cross-linking intensity. In a specific embodiment, UV intensity is about 50-90% of the intensity during the cross-linking operation.

In some embodiments, the porogen removal operation may be accomplished in part by a thermal anneal (i.e., with zero UV intensity). Temperatures required for purely thermal anneal depend on the particular porogen used. Typical temperatures range from around 300° C.-450° C., e.g., around 400° C. The use of a thermal cure alone to remove porogen may be beneficial to reduce the total time of UV exposure.

Unlike in a conventional single operation UV cure process, conditions during the porogen removal operation are such that the film is typically made softer or more compliant as a result of this operation. In some embodiments, substrate temperature but not UV intensity may be constant during porogen removal and cross-linking operations. The constant substrate temperature may be maintained by varying the pedestal temperature setpoint while the UV intensity varies. It is believed that constant substrate temperature reduces total cure time by maintaining a consistent shrinkage rate and increases porogen diffusion to film surface. Thus it is desirable to keep the wafer temperature as high as possible without going over thermal budget limits. If the substrate temperature is not kept constant by keeping a high pedestal temperature setpoint, the substrate temperature would be lower during the porogen removal than during the cross-linking operation. The lower temperature would reduce the shrinkage rate, lengthen the total cure time, and may be allow enough cross linking so as to entrap porogen.

Figure 2:
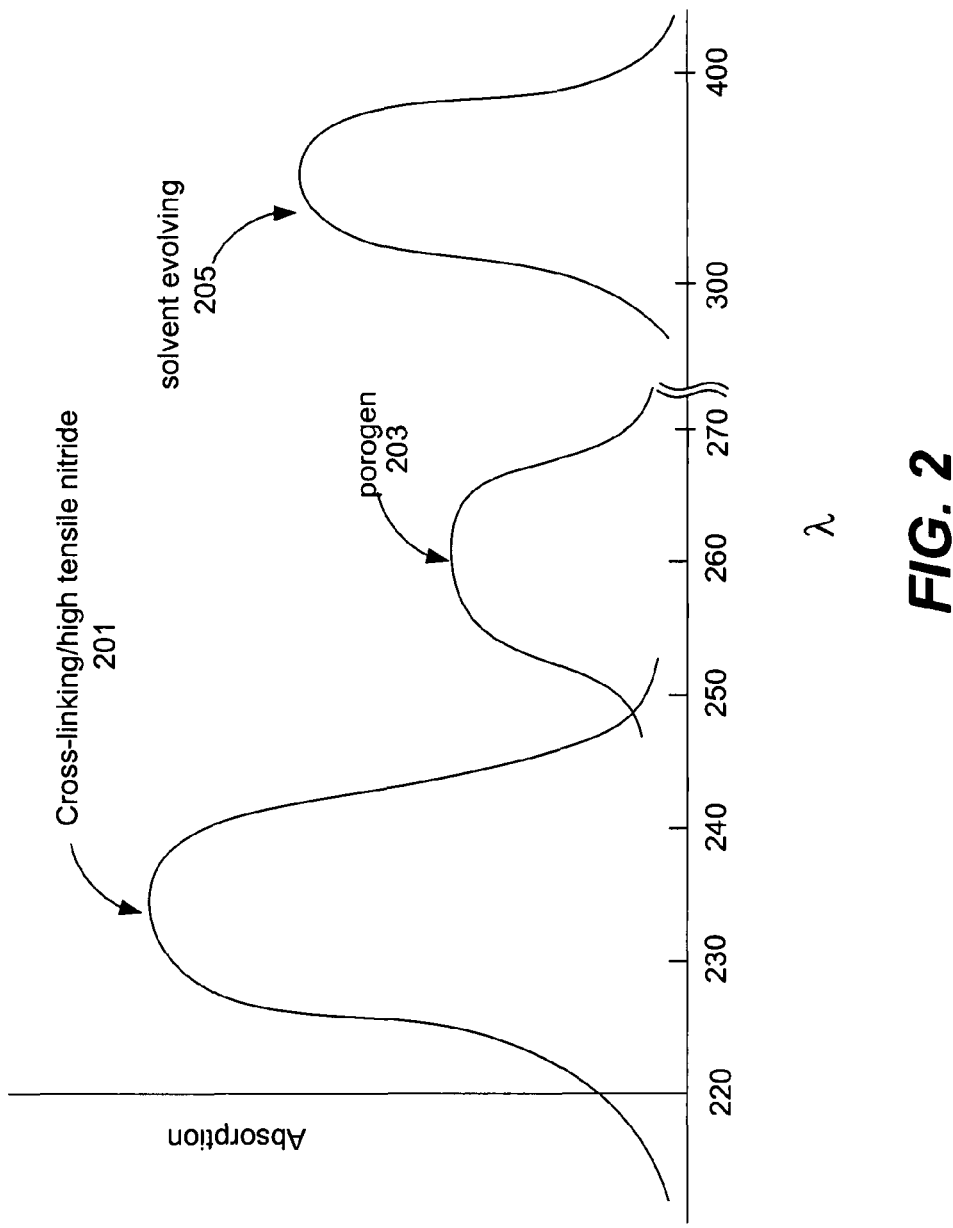
FIG. 2 is a rough schematic representing UV absorption as a function of wavelength for certain processes in accordance with the present invention.

In certain embodiments, conditions during the porogen removal operation and the cross-linking operation or operations are also differentiated by the wavelength of the UV radiation. FIG. 2 shows a rough schematic of UV absorption as a function of wavelength for a porogen and cross-linking in a dielectric material. As can be seen from the figure, absorption of radiation by the backbone is highest shorter wavelengths, including wavelengths about 220-250 nm, and decreases around higher wavelengths. Absorption of radiation by the porogen is dependent on the particular porogen used; the porogen shown in FIG. 2 has an absorption peak around 260 nm. It should be noted that the absorption spectra depicted are examples; the absorption spectra of the porogen and backbone depends on the particular compositions. In certain embodiments, a first station of a multi-station cure chamber has a radiation source emitting radiation of wavelengths of common porogens, e.g., around 200 nm-500 nm, 200 nm-280 nm, or around 250 nm, while other stations dedicated to increasing the mechanical strength of the porogen have radiation sources that emit lower wavelength radiation.

UV exposure time is largely a function of both the lamp intensity and the density and thickness of the precursor layer including porogen and structure former. UV exposure times range from seconds to tens of hours. Preferably, for commercial applications, the exposure time will be about 5 minutes or less. In a preferred embodiment, the exposure time ranges from about 1 second up to 5 minutes. Purely thermal porogen removal operations may take longer, e.g., hours to tens of hours.

In one embodiment, one or more short pulse of UV light is used to dissociate the porogen in the as-deposited ultra low-k film. The duration of this pulse may be between about 5 and 60 seconds and depends on the as-deposited ULK film thickness. Lamp type, lamp power, pulse duration, window type, and cure temperature may be independently controlled to maximize porogen dissociation. After the pulse is complete, the radiation source turns off or goes to standby and the film will soak at the cure temperature for a period of time as the porogen is evolved and removed from the film. The radiation intensity may reduce to a lower amount or taper off.

The porogen removal operation may be performed in one or more stations. Because UV radiation breaks bonds in the film as well as dissociates porogen, cure at subsequent stations may be tailored to remove the remaining porogen without removing significant amounts of methyl groups. Methyl group removal damages the ULK film, which may increase the dielectric constant, and should be reduced when possible. In a subsequent station, the UV radiation may also be pulsed, followed by a temperature soak. The reverse may be suitable also: a temperature soak followed by a UV radiation pulse. Additionally, more than one radiation source may be pulsed in the same station. For example, at station 2, a UV radiation source configured for porogen removal may be pulsed, followed by one or more pulse of a radiation source configured for cross-linking.

As indicated the UV radiation may directly interact with the porogen or it may generate a reactive species that in turn attacks the porogen. If the exclusive mechanism is direct interaction, then the porogen removal operation is preferably performed an inert environment. This may be a vacuum, a noble gas atmosphere (e.g., argon or helium), or a nitrogen atmosphere, etc. In a preferred embodiment, a mixture of argon and helium is used in a reduced pressure environment, e.g., about 10 Torr. In some embodiments, a quantity of hydrogen gas may be used as well. If reactive species are to be generated, then the atmosphere could include oxygen, $N_2O$, $CO_2$, $NO_2$ or a combination thereof. When exposed to UV radiation, molecular diatomic oxygen forms less stable but more aggressive oxidizing species such as ozone and oxygen radicals. The ozone and oxygen radicals are sufficiently strong oxidizing agents to oxidize the organic porogen. The porogen is then removed in the form of small volatile hydrocarbon molecules and oxygen containing species.

If not removed quickly the volatile porogen removed from the substrate may adhere to the chamber walls or windows. The porogen may become a source of contamination for other substrates or cloud the windows and reduce the effectiveness of the UV radiation. U.S. patent application Ser. No. 11/391,134, filed March 2006 and titled PURGING OF POROGEN FROM UV CURE CHAMBER, describes mechanisms to ensure that the porogen is removed quickly, and is hereby incorporated by reference in its entirely, for all purposes. UV-mediated porogen removal is also discussed in commonly assigned U.S. Pat. No. 7,208,389, issued Apr. 24, 2007 and titled METHOD OF POROGEN REMOVAL FROM POROUS LOW-K FILMS USING UV RADIATION, which is hereby incorporated by reference in its entirety, for all purposes.

Cross-Linking

As noted above, after the porogen removal operation, the film is typically soft and compliant. The cross-linking operation increases the hardness and/or modulus of the film. The cross-linking operation is so called because it is believed that it increases the number of crosslinks (i.e., the number of covalent bonds) within the dielectric film, thereby increasing the film hardness. However, the invention is not limited to a particular mechanism of increasing the hardness and modulus. Hardness and modulus are well defined within the art and will not be discussed in detail herein. Measures of film hardness and modulus presented herein may be made with any suitable apparatus including nano-indenter device.

One way to characterize mechanical performance of a dielectric film is via a "cracking threshold" measurement. This is a measure of thickness of a dielectric film on a blank substrate (e.g., a flat 300 mm wafer) that can be deposited without forming a crack. In a typical experiment, the dielectric is deposited to various thicknesses using a single set of process conditions. The resulting wafer (with dielectric film) is set aside without disturbance for a period of time (e.g., one day) and then examined for cracks. The greatest thickness at which no crack is observed is the cracking threshold. For many processes, the cracking threshold is measured in micrometers. The cracking threshold as well as crack propagation velocity in dielectric films is exponentially dependent on film stress. Thus it is important to minimize thin film stresses to prevent crack propagation through the dielectric layer during the packaging process. As indicated above, in certain embodiments, multi-operation porogen removal and curing operations of the present invention result in minimizing the stress of the film.

The cross-linking operation is performed by exposing the porous dielectric film to UV radiation. In certain embodiments, the film is exposed to ultraviolet radiation. However, as noted above, UV radiation having wavelengths as low as 150 nanometers may be used to increase cross-linking.

Substrate temperatures may range from around room temperature to about 450° C., for example around 400° C. As indicated, in certain embodiments, substrate temperatures during the cross-linking operation are typically higher than during porogen removal. In a particular embodiment, substrate temperature during porogen removal is about 375° C., and during the cross-linking operation around 400° C. In some embodiments, substrate temperature during the cross-linking operation or operations may be as high as the thermal budget allows.

UV intensity may also be higher during cross-linking than during porogen removal, as discussed above. UV exposure time is largely a function of both the lamp intensity and the density of the precursor layer including porogen and structure former. UV exposure times range from seconds to tens of hours. Preferably, for commercial applications, the exposure time will be about 5 minutes or less. In a preferred embodiment, the exposure time ranges from about 1 second up to 5 minutes.

The UV radiation during the cross-linking operation may be modulated, e.g., by intensity, to facilitate mechanical strengthening. This is described in the commonly assigned U.S. patent application Ser. No. 10/825,888, filed Apr. 16, 2004 and titled "Method To Improve Mechanical Strength Of Low-K Dielectric Film Using Modulated UV Exposure," which is hereby incorporated by reference in its entirety.

Increasing Tensile Stress in Silicon Nitride Film

A silicon nitride film may be treated to increase tensile stress in accordance with the present invention. For certain applications, silicon nitride may be used in place of silicon dioxide for top layer protection because it is harder and has better hermeticity, etch selectivity, and protects regions below it against oxidation. Silicon nitride films may be deposited with an LPCVD (low-pressure chemical vapor deposition) or a PECVD (plasma-enhanced chemical vapor deposition) process.

UV radiation may be used to change the stress properties of the silicon nitride film, generally to increase its tensile stress. Tensile nitride films are used to create and transfer strain to the source and drain regions of NMOS devices. This strain is transferred to the channel regions of the NMOS devices and improves the mobility of carriers, and thus performance of the transistor in an integrated circuit.

UV radiation is known to increase silicon nitride film tensile stress. It is believed that UV radiation breaks Si—H and Si—OH bonds in a PECVD or LPCVD nitride film and allows the hydrogen and resulting water vapor to diffuse out of the film. The presence of bonded hydrogen in the film reduces the nominal spacing between the molecules and generates compressive stress. When the hydrogen is removed, the spacing between the molecules is increased and the film becomes more tensile.

The degree of change in tensile stress can be controlled. Factors include the thickness of the silicon nitride film, the power and intensity of the UV radiation, the duration of exposure, and the temperature of the wafer. By modulating these parameters, the change in tensile stress can be controlled. Of course, some purge gas is flowed to remove the hydrogen and water vapor removed from the film.

In some embodiments, the UV treatment of silicon nitride has two operations: an initial bond breaking operation; and a bond breaking and diffusion operation. It is known in the art that a partially fabricated semiconductor wafer may be subjected to high temperature for a limited time. Every time a wafer is heated to a high temperature, the doped regions in the wafer may spread and regions of mismatched coefficients of thermal expansion may cause extrusions or even delaminations between layers. Every time a wafer is heated and cooled, between 400° C. and room temperature, more crystal dislocation forms, which may cause device failure. On the other hand, diffusion of hydrogen and water vapor through a film is correlated to wafer temperature. In order to minimize the duration of higher temperature exposure, the initial bond breaking operation occurs with a lower wafer temperature. As more hydrogen and hydroxyls are freed, the wafer temperature is increased in the second operation to facilitate removal of the hydrogen and water vapor from the film. The use of two operations to increase the tensile stress of silicon nitride films minimizes the duration of high wafer temperature and maximizes the bond-breaking effects of the UV radiation. In some cases, the wafer temperature may be as high as 480° C. during the higher temperature diffusion operation.

Spin-on Films

A spin-on ULK film may be treated with UV radiation first to evolve the solvent and then to harden and strengthen the film. As its name states, the spin-on ULK film is applied to the wafer via a spinning coating process. First a high viscosity liquid precursor containing the film is applied to the wafer while the wafer is spinning to evenly spread the liquid solution to all parts of the wafer. The spin-on process was first used to apply a thin layer of photoresist. This simple process can planarize the surface of the wafer, because the liquid precursor can form a thin film covering all features.

After the substrate is coated with the liquid precursor, it must undergo annealing to drive-off the solvent; complete chemical reactions; drive off unreacted monomers and oligomers; and to densify the film. Depending on the precursor, different solvents may be used. Generally, two or three operations of bake and cure are used. An initial operation at a lower temperature is generally used to drive off the solvent and to complete chemical reactions and a second operation at a higher temperature is generally used to drive off unreacted materials and to densify the film.

UV radiation can be used instead of the thermal annealing process to complete the spin-on film deposition. In accordance with the present invention, two or three operations can be performed in one semiconductor processing tool. Just like the thermal annealing process, the solvents are first evolved from the spin-on film while the chemical reactions complete. Liquid precursor solvents tend to be volatile and easily evolved; therefore, a lower wafer temperature and less UV intensity is required. However, the purge gas flow rate must be high to remove all evolved solvent and keep the reactor clean. The UV parameters must favor solvent evolution so as not to cause premature hardening and strengthening of the film and trap solvent particles in the dielectric film. The UV wavelengths may be tuned to target the specific solvent. Longer wavelengths may be used to effectively volatilize the solvent without rearranging the chemical bonds within the film. Managing the relative rates at which solvent in a film is evolved and that at which the film hardens is important for the complete removal of solvent.

The next UV operation would be to drive off unreacted organic materials. This step is very similar to the operations for porous ULK films. In this operation, the UV intensity and wafer temperature are increased to that for cross-linking. The UV wavelengths are also changed to the spectral band that favors cross-linking. The purge gas flow rate is still high, to remove any unreacted organic materials. After this operation, the remaining operation is the same as that for cross-linking of a porous ULK film, which is discussed above.

ULK Damage Repair

Carbon-containing low-k materials achieve lower dielectric constants through the incorporation of non-polar covalent bonds (e.g., from the addition of carbon) and the introduction of porosity to decrease film density. Introducing porosity or the incorporation of terminal bonds, such as Si—$CH_3$, breaks the continuity of the rigid Si—O—Si lattice of traditional oxides, yielding a lower dielectric constant film that is both mechanically and chemically weaker. Because of these weaknesses, carbon-containing low-k films are susceptible to kinetic plasma damage and chemical damage. Plasma damage can break Si—$CH_3$ bonds in the ULK film and removes these methyl groups. Chemical mechanical polishing (CMP) slurries can chemically remove carbon groups such as —$CH_3$ from the surface of the low-k dielectric film.

Other damage to ULK film may include the absorption of moisture and reactions causing formation of Si—OH and Si—O. Incorporation of silanol groups increases the k value of the film and is thus undesirable. Moreover, the moisture can remain trapped in the dielectric and oxidize the barrier material, allowing subsequent copper diffusion. Moisture from ambient atmosphere and present in CMP slurries may present these issues to damaged ULK films where the —$CH_3$ groups are removed.

These process-induced damages may be treated with UV radiation having certain characteristics. For ULK damage repair, it is useful to note that excess UV radiation can cause more damage by removing even more methyl groups. Controlled UV exposure to repair the damage should not cause significant amount of methyl loss. First the UV exposure should not penetrate more than a few monolayers below the surface of the ULK film. As most of the damage caused by planarization (slurry) and plasma is on the surface, unnecessary UV exposure to deeper layers may cause more methyl bonds to break and unnecessary methyl loss. The low penetration may be accomplished by a shorter exposure and/or with a lower intensity. One alternative is to pulse the UV radiation during processing. A wafer may be exposed to a short radiation pulse, between 5 and 60 seconds, followed with soaking at temperature of about 200-250° C. with purge gas at each station. The pulse need not be a step function, for example, a UV radiation pulse may taper off in intensity.

As an alternative, carbon containing reactive gas may be flowed to the wafer during a second operation to replace the silanol bonds broken with a methyl group. This alternative not only repairs the ULK film, but also replaces the damaged portions. The carbon containing reactive gas may be organo-silanes, -silazanes, -siloxanes, alkanes, alkenes, alkynes, or acetaldehyde. Example organo-silanes, organo-silazanes, or organo-siloxanes may be dichlorodimethylsilane (DCDMS), chlorotrimethylsilane (CTMS), hexamethyldisilazane (HMDS), hexamethyldisiloxane (HMDSO), or tetravinyltetramethylcyclotetrasiloxane (TVTMCTS)). Example alkanes may be methane or ethane. Example alkenes and alkynes may be ethylene or acetylene. These reactant gases may be disassociated by the UV radiation into methyl groups and other components to react with an activated damaged film.

In a first operation, the UV radiation may activate the damaged ULK film and break silanol bonds. Purge gas is flowed to the wafer to facilitate removal of the by products. In a second operation, the UV radiation cross-links the surface Si groups to fill gaps from the departed methyl groups and reforms the highly strained bonds. The cross-linking removes dangling bonds and densifies the film. Alternatively, the UV radiation may disassociate reactant gases and reincorporate the methyl groups into the surface layers of the ULK film if a carbon-containing reactant gas is used. The methyl group incorporation may occur concurrently with the cross-linking operation.

Apparatus

The present invention can be implemented in many different types of apparatus. Generally, the apparatus will include one or more chambers (sometimes referred to as process reactors) that house one or more wafers and are suitable for wafer processing. At least one chamber will include a UV source. A single chamber may be employed for all operations of the invention or separate chambers may be used. Each chamber may house one or more wafers for processing. The one or more chambers maintain the wafer in a defined position or positions (with or without motion within that position, e.g., rotation, vibration, or other agitation) during UV treatment operations. For certain operations in which the wafer is to be heated, the apparatus may include a heating platen.

In one embodiment, the wafer processing tool includes a set of individual chambers. A wafer is loaded from a wafer cache to a first chamber. The wafer cache may be a FOUP, a load lock, or any wafer storage unit. In the first chamber, the wafer is exposed to UV radiation with characteristics selected for a first process. This first process may be to dissociate porogen while minimizing cross-linking. Once the wafer has finished processing in the first chamber, it is moved to a second chamber where it undergoes a second process. The second process may differ from the first process by one or more exposure characteristics, such as UV intensity, wafer temperature, spectral distribution, wavelengths, and purge gas flows. The second process may be to cross link a ULK film.

In certain embodiments the multi-operation cure process is performed using a multi-station cure chamber. As discussed above, in certain embodiments, the multiple operation cure processes of the invention rely on being able to independently modulate the UV intensity, wavelength, spectral distribution and substrate temperature of each step or operation. Additionally, certain inert or reactive gases may be injected during the cure process at the same or different flowrates at each step. For example, in one embodiment, the porogen removal operation uses the same UV intensity but a lower substrate temperature than the cross-linking operation. In another embodiment, the porogen removal operation uses a same substrate temperature and a lower UV intensity than the cross-linking operation. Similarly, various effects of UV exposure (porogen removal, change in stress, change in hardness, process time, etc.) may be modulated by independently modulating UV intensity and substrate temperature. Detail process parameters of various examples are discussed below.

Multi-station cure chambers capable of modulating these effects by providing independent control of the substrate temperature and the UV intensity are described in above-referenced U.S. patent application Ser. No. 11/115,576 and in commonly assigned U.S. patent application Ser. No. 11/184, 101, filed Jul. 18, 2005, titled "Cast Pedestal With Heating Element and Coaxial Heat Exchanger," which is hereby incorporated by reference in its entirety and for all purposes.

These chambers decouple substrate temperature and UV intensity by reducing the amount of IR radiation on the wafer and/or providing independent heat transfer mechanisms to and from the wafer. For example, the chambers may be equipped with cold mirrors or other reflectors to reduce the amount of IR radiation incident on the wafer. In addition, each pedestal or other substrate support may have an independent heat transfer mechanism to help maintain a substrate temperature regardless of the UV intensity. Thus, unlike conventional UV cure chambers where substrate temperature is coupled to UV intensity, the substrate temperature and UV intensity may be independently set for a wide range of temperatures and intensities.

Figures 3A, 3B:
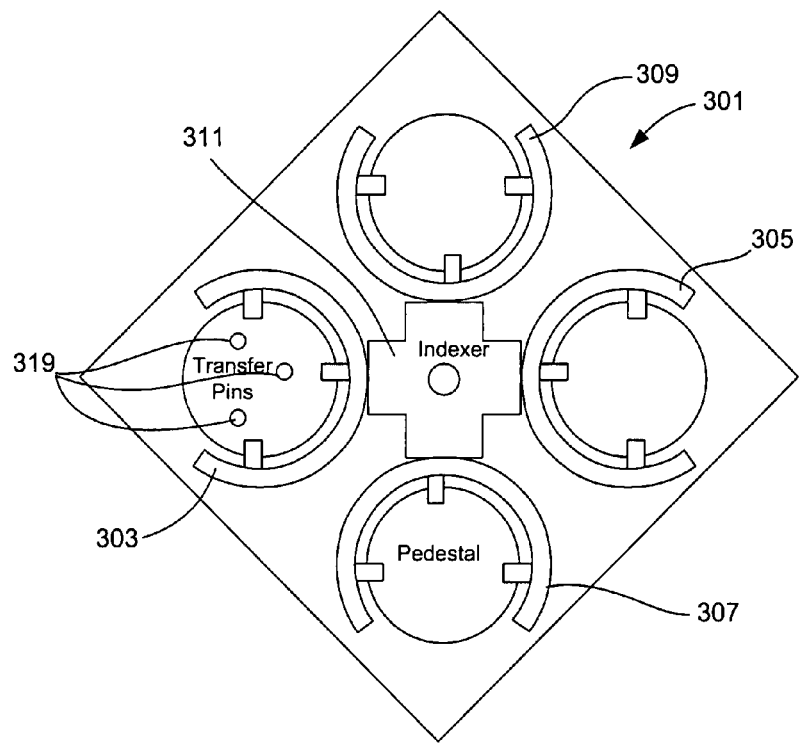
FIGS. 3 A and B are schematic representations of an apparatus suitable for UV porogen removal in accordance with certain embodiments of this invention.

FIGS. 3A and 3B show one embodiment of an apparatus appropriate for use with certain embodiments of the invention that uses UV flood lamps. Chamber 301 includes multiple cure stations 303, 305, 307 and 309, each of which accommodates a wafer. Station 303 includes transfer pins 319. FIG. 3B is a side view of the chamber showing stations 303 and 305 and wafers 313 and 315 located above pedestals 323 and 325. There are gaps 304 between the wafers and the pedestals. The wafer may be supported above the pedestal by an attachment, such as a pin, or floated on gas. Parabolic or planar cold mirrors 353 and 355 are located above UV flood lamp sets 333 and 335. UV light from lamp sets 333 and 335 passes through windows 343 and 345. Wafers 303 and 305 are then exposed to the radiation. In alternative embodiments, the wafer may be supported by the pedestals 323 and 325. In such embodiments, the lamps may or may not be equipped with cold mirrors. By making full contact with the pedestal, the wafer temperature may be maintained by use of a conductive gas such as helium or a mixture of helium and argon at a sufficiently high pressure, typically between 50 and 760 Torr, but preferably between 100 and 600 Torr.

In operation, a wafer (or other substrate) enters the chamber at station 303 where the porogen removal operation is performed. Pedestal temperature at station 303 is set to a first temperature, e.g. 375° C., with the UV lamps above station 303 set to a first intensity, e.g., 70% maximum intensity. After having some or all of the porogen removed in station 303, the porous dielectric matrix is soft and is transferred to station 305 for hardening. Pedestal temperature at station 305 is set to a second temperature, e.g., 400° C. and UV intensity is set to a second intensity, e.g. 100%, or maximum, intensity. Stations 307 and 309 may also be used for increasing hardness. For example, conditions at stations 305, 307 and 309 may be the same. Each wafer is sequentially exposed to each UV light source.

In some cases, different stations irradiate the wafer at different wavelengths or wavelengths ranges. The example above uses a UV flood lamp, which generates radiation in a broad spectrum. Optical components may be used in the radiation source to modulate the part of the broad spectrum that reaches the wafer. For example, reflectors, filters, or combination of both reflectors and filters may be used to subtract a part of the spectrum from the radiation. One such filter is a bandpass filter.

Optical bandpass filters are designed to transmit a specific waveband. They are composed of many thin layers of dielectric materials, which have differing refractive indices to produce constructive and destructive interference in the transmitted light. In this way optical bandpass filters can be designed to transmit a specific waveband only. The range limitations are usually dependant upon the interference filters lens, and the composition of the thin-film filter material. Incident light is passed through two coated reflecting surfaces. The distance between the reflective coatings determines which wavelengths will destructively interfere and which wavelengths will be allowed to pass through the coated surfaces. In situations where the reflected beams are in phase, the light will pass through the two reflective surfaces. However, if the wavelengths are out of phase, destructive interference will block most of the reflections, allowing almost nothing to transmit through. In this way, interference filters are able to attenuate the intensity of transmitted light at wavelengths that are higher or lower than the desired range.

Another filter that can attenuate the wavelengths of the radiation reaching the wafer is the window 343, typically made of quartz. By changing the level of metal impurities and water content, the quartz window can be made to block radiations of undesired wavelengths. High-purity Silica Quartz with very little metal impurity is more transparent deeper into the ultraviolet. As an example, quartz with a thickness of 1 cm will have a transmittance of about 50% at a wavelength of 170 nm, which drops to only a few percent at 160 nm. Increasing levels of impurities in the quartz cause transmission of UV at lower wavelengths to be reduced. Electrically fused quartz has a greater presence of metallic impurities, limiting its UV transmittance wavelength to around 200 nm. Synthetic silica, on the other hand, has much greater purity and will transfer down to 170 nm. For infrared radiation, the transmittance through quartz is determined by the water content. More water in the quartz means that infrared radiation is more likely absorbed. The water content in the quartz may be controlled through the manufacturing process. Thus, the spectrum of radiation transmission through the quartz window may be controlled to cutoff or reduce UV transmission at shorter wavelengths and/or to reduce infrared transmission at longer wavelengths.

Another type of filter is UV cut-off filters. These filters do not allow UV transmission below a set value, e.g. 280 nm. These filters work by absorbing wavelengths below the cut-off value. This may be helpful to optimize the desired cure effect.

Radiation wavelength can also be controlled by modifying the properties of the light generator. UV flood lamps can generate a broad spectrum of radiation, from UV to infrared, but other light generators may be used to emit a smaller spectrum or to increase the intensity of a narrower spectrum. Other light generators may be mercury-vapor lamps, doped mercury-vapor lamps, electrode lamps, excimer lamps, excimer lasers, pulsed Xenon lamps, doped Xenon lamps, noble gas lamps (e.g., argon lamps), metal halide lamps (e.g., HgI lamps, RF driven lamps (e.g., inductively and capacitively coupled lamps), DC lamps. Lasers such as excimer lasers can emit radiation of a single wavelength. When dopants are added to mercury-vapor and to Xenon lamps, radiation in a narrow wavelength band may be made more intense. Common dopants are iron, nickel, cobalt, tin, zinc, indium, gallium, thallium, antimony, bismuth, or combinations of these.

For example, mercury vapor lamps doped with indium emits strongly in the visible spectrum and around 450 nm; iron, at 360 nm; and gallium, at 320 nm. Radiation wavelengths can also be controlled by changing the fill pressure of the lamps. For example, high-pressure mercury vapor lamps can be made to emit wavelengths of 250 to 440 nm, particularly 310 to 350 nm more intensely. Low-pressure mercury vapor lamps emit at shorter wavelengths.

In addition to changing light generator properties and the use of filters, reflectors that preferentially deliver one or more segments of the lamps spectral output may be used. A common reflector is a cold mirror that allows infrared radiation to pass but reflects other light. Other reflectors that preferentially reflect light of a spectral band may be used. Therefore a wafer may be exposed to radiation of different wavelengths at different stations. Of course, the radiation wavelengths may be the same in some stations.

In FIG. 3B, pedestals 323 and 325 are stationary. Indexer 311 lifts and moves each wafer from one pedestal to another between each exposure period. Indexer 311 is an indexer plate 321 attached to a motion mechanism 331 that has rotational and axial motion. Upward axial motion is imparted to indexer plate 321 to pick up wafers from each pedestal. The rotational motion serves to advance the wafers from one station to another. The motion mechanism then imparts downward axial motion to the plate to put the wafers down on the stations.

Pedestals 323 and 325 are electrically heated and maintained at a desired process temperature. Pedestals 323 and 325 may also be equipped with cooling lines, if needed. Each pedestal may have its own heating system. In an alternate embodiment, a large heater block may be used to support the wafers instead of individual pedestals. A thermally conductive gas, such as helium, is used to effect good thermal coupling between the pedestal and the wafer. In some embodiments, cast pedestals with coaxial heat exchangers may be used. These are described in above-referenced application Ser. No. 11/184,101.

FIGS. 3A and 3B show only an example of a suitable apparatus and other apparatuses designed for other methods involved in previous and/or subsequent processes may be used. For example, in another embodiment that uses flood lamps, the wafer support is a carousel. Unlike with the stationary pedestal wafer supports, the wafers do not move relative to the carousel. After a wafer is loaded onto the carousel, the carousel rotates, if necessary, to expose the wafer to light from a UV lamp set. The carousel is stationary during the exposure period. After the exposure period, the carousel rotates to advance each wafer for exposure to the next set of lamps. Heating and cooling elements may be embedded within the rotating carousel. Alternatively the carousel may be in contact with a heater plate or hold the wafers so that they are suspended above a heater plate.

In certain embodiments, the substrates are exposed to UV radiation from focused, rather than, flood lamps. Unlike the flood lamp embodiments wherein the wafers are stationary during exposure (as in FIGS. 3A and b), there is relative movement between the wafers and the light sources during exposure to the focused lights as the wafers are scanned.

Other apparatuses designed for other methods involved in previous and/or subsequent processes may be used. For example, methods of the invention may be used with a standard PECVD chamber used to deposit the precursor layer if the chamber is equipped with a UV radiation source. Some supercritical fluid chamber systems may also be configured to include a UV radiation source. Many of these systems may also be used to perform post-porogen removal procedures. In these cases, the chamber system will likely be pumped out between each of the process operations.

EXAMPLES

Example processes in accordance with the present invention are discussed below. The example processes list parameters of wafer temperature, UV intensity as percentage of full power, desired spectral band as a wavelength range, and gas flow rate for each of stations one to four for a four-station chamber. These example processes are suitable for use in a Novellus SOLA, which uses a four-station sequential processing chamber. These example processes may also be suitable for use in other semiconductor processing equipment, such as ones that use multiple chambers or multi-stations chambers with fewer or more than four stations.

The first example relates to the porous ULK film embodiment referenced above. Wafers having a porous ULK film deposited thereon are treated with UV radiation first to remove the porogens in the ULK film and then to strengthen and harden the film. Because the porogen becomes harder to remove after the ULK film is hardened and strengthened, the process conditions in the first station must favor porogen removal without cross-linking the film. In station 1, the wafer is exposed to a lower UV intensity radiation than at stations 2 to 4 because the ULK film hardens and strengthens more at higher exposures. The UV intensity is lower at station 1, at about 35% of maximum, which may be about 200 mW/cm$^2$ to 400 mW/cm$^2$ in the desired spectral band. The UV wavelength range at station 1 is about 250-270 nm, a longer wavelength than at stations 2 to 4, which are at about 220-250 nm. As discussed above, the different wavelengths may be achieved using different light generators and optical components. Note that the pedestal temperature changes between station 1 and station 2, but the wafer temperature does not. The wafer temperature depends on heat transfer from the pedestal, the radiation intensity, and convection through the gas flow. At station 1, the pedestal transfers more heat because the UV intensity is lower. When the UV intensity is increased in stations 2 to 4, the pedestal temperature is correspondingly lowered to maintain the wafer temperature. Maintaining the same wafer temperature from station to station keeps the shrinkage rate consistent and reduces thermal stress on the wafer. The total process time is reduced as compared to having a lower UV intensity at station 1 without a higher pedestal temperature. The wafer temperature of 400-410° C. keeps the process within thermal budget.

Further, the gas flow rates are higher in stations 1 and 2 than at stations 3 and 4. In one particular implementation of this invention, the higher gas flow purges the porogen from the wafer and inside surfaces of the chamber. By the time the wafer reaches stations 3 and 4, most of the porogen has generally been removed and less purging is required. The different gas flow rates may be accomplished by using different mass flow controllers (MFCs) from the same gas inlet header, or, in some instances when different gases are required in each station, different gas inlet headers. In this example, station 1 differs from stations 3 and 4 in every process parameter, but is different from station 2 by three process parameters. On the other hand, only the purge gas flow rate is different as between station 2 and stations 3 and 4. The chamber pressure may be preferably at 10 Torr. The chamber pressure also may be greater than about 8 Torr, about 5-20 Torr, about 8-15 Torr, or about 10 Torr. The preferred purge gas is a mixture of helium and argon, at a ratio of about 1 Helium: 2 Argon. Helium only or argon only as the purge gas may also be used. Process parameters for the preferred embodiment with the mixture of argon and helium as purge gas are summarized in Table 1A. Table 1B summarizes process parameter for the helium only embodiment.

TABLE 1A

Process Example for Porous ULK Film

| Parameter | Station #1 | Station #2 | Station #3 | Station #4 |
|---|---|---|---|---|
| Wafer Temperature | 400-410° C. | 400-410° C. | 400-410° C. | 400-410° C. |
| Pedestal temperature | 415° C. | 350° C. | 350° C. | 340° C. |
| UV Intensity (% of full power) | 35% | 100% | 100% | 100% |
| Desired Spectral band | 250-270 nm | 220-250 nm | 220-250 nm | 220-250 nm |
| Gas Flow Rate (helium and argon at about 1:2) | 15-25 slm | 15-25 slm | 5-15 slm | 5-15 slm |

TABLE 1B

Process Example for Porous ULK Film

| Parameter | Station #1 | Station #2 | Station #3 | Station #4 |
|---|---|---|---|---|
| Wafer Temperature | 400-410° C. | 400-410° C. | 400-410° C. | 400-410° C. |
| Pedestal temperature | 415° C. | 375° C. | 375° C. | 375° C. |
| UV Intensity (% of full power) | 35% | 100% | 100% | 100% |
| Desired Spectral band | 250-270 nm | 220-250 nm | 220-250 nm | 220-250 nm |
| Gas Flow Rate (helium only) | 10-25 slm | 10-25 slm | 5-12 slm | 5-12 slm |

As another example, a silicon nitride film may be treated to increase tensile stress in accordance with the present invention. For certain applications, silicon nitride may be used in place of silicon dioxide for top layer protection because it is harder and has better hermeticity, etch selectivity, and protects regions below it against oxidation. Silicon nitride films may be deposited with a LPCVD (low-pressure chemical vapor deposition) or a PECVD (plasma-enhanced chemical vapor deposition) process. UV radiation may be used to change the stress properties of the silicon nitride film, generally to increase its tensile stress. This tensile stress increase can be performed in two operations. In this example, the wafer is heated to 400° C., in some cases up to 480° C., in the first station, while the UV intensity is at the maximum, about 200 to 400 mW/cm$^2$. The UV wavelength range is about 220-250 nm, similar to that for building ULK film strength and hardness. The gas flow is at 4 slpm. Because no gaseous by-product is removed in this operation, the gas flowrate is lower than those of other processes. In stations 2 to 4, the wafer is heated to 415° C., and all the other parameters are kept about the same. The process chamber pressure may be at atmosphere or at a vacuum. Process parameters are summarized in Table 2.

TABLE 2

Process Example for High Nitride Film

| Parameter | Station #1 | Station #2 | Station #3 | Station #4 |
|---|---|---|---|---|
| Wafer Temperature | 400° C. | 415° C. | 415° C. | 415° C. |
| UV Intensity (% of full power) | 100% | 100% | 100% | 100% |
| Desired Spectral band | 220-250 nm | 220-250 nm | 220-250 nm | 220-250 nm |
| Gas Flow Rate | 2-6 slm | 2-6 slm | 2-6 slm | 2-6 slm |

In yet another example, a spin-on ULK film may be treated with UV radiation first to evolve the solvent and then to harden and strengthen the film. As its name states, the spin-on ULK film is applied to the wafer via a spinning process. First a liquid solution containing the film is applied to the wafer, and the wafer is spun to evenly spread the liquid solution to all parts of the wafer. UV radiation can be applied to the deposited film to drive-off the solvent; complete chemical reactions; drive off unreacted monomers and oligomers; and to densify the film. These processes may be achieved in three operations. In the first station, the wafer temperature is kept at about 350° C., a little lower than stations 2 to 4, which are kept at 400° C. The intensity is also lower at station 1, at about 70% of the maximum, which may be about 200 to 400 mW/cm$^2$. The UV wavelength range is at about 300-400 nm, which is longer than the 220-250 nm used in stations 2 to 4. In station 1, most the solvent is evolved from the spin-on ULK film. Premature hardening may trap some solvents and stop chemical reactions; therefore, station 1 parameters favor solvent evolution and not film hardening or strengthening. The purge gas flows at a high rate, 17 slm, to remove all the solvents evolved from the film. In station 2, the purge gas flow is still high, but the wafer temperature, UV intensity and wavelength, are all changed to the parameters that favor film hardening and strengthening. In this station, any remaining unreacted monomers and oligomers are removed under high purge gas flow. In stations 3 and 4, the purge gas flow is reduced to 8 slm while the other parameters remain constant. This example is similar to that of the porous ULK film example in Table 1, which also has three distinct stages. Process parameters are summarized in Table 3.

TABLE 3

Process Example for Spin-on ULK Film

| Parameter | Station #1 | Station #2 | Station #3 | Station #4 |
|---|---|---|---|---|
| Wafer Temperature | 350° C. | 400° C. | 400° C. | 400° C. |
| UV Intensity (% of full power) | 70% | 100% | 100% | 100% |
| Desired Spectral band | 300-400 nm | 220-250 nm | 220-250 nm | 220-250 nm |
| Gas Flow Rate | 10-25 slm | 10-25 slm | 5-12 slm | 5-12 slm |

In one more example, a damaged ULK film may be repaired with UV radiation. In the trench formation process, etching, ashing, planarizing, and wet or dry cleaning damage ULK film by removing organic groups, generally —CH$_3$ groups, in the low-k material of the trench sidewalls and bottom causing bonds to dangle or strain, e.g., Si—O—Si or Si—CH$_2$—Si. When exposed to ambient atmosphere or moisture, the dangling Si bonds form silanol groups (Si—OH) that may increase the dielectric constant. The UV radiation may repair this damage by cleaving the silanol bonds and cross-linking the film Si groups to fill gaps from the departed methyl (—CH$_3$) groups. As an option, departed methyl groups may also be replenished using carbon containing gas reactants. The UV radiation activates the damaged ULK film layer and cleaves silanol bonds to allow methyl groups from the reactant gas to fill damaged gap.

An example parameters for the film repair is shown in Table 4. At station 1, the wafer temperature is maintained at about 200-250° C. and exposed to a UV band of 300-400 nm at about 70%. At station 1, the silanol bonds are broken and the resultant by-products removed with a relatively higher purge gas flowrate, at about 10-25 slm. The purge gas may be nitrogen, helium, argon, neon, or a combination of these. At station 2, the UV intensity is increased with a UV spectral band having shorter wavelengths. At this station, the purge gas flowrate remains high to completely remove all byproducts, and the cross-linking or the carbon group replacement reactions start. At station 3 and 4, the gas flowrate is reduced after most of the gaseous by products have been removed. The UV spectral band and intensity remains at that of station 2. Note that although the wafer temperature is maintained to be the same from station 1 to 4, the pedestal temperature set point may be different because the UV radiation at different intensities may contribute more or less heat. Thus, at stations 2-4, the pedestal temperature is lower than that at station 1.

TABLE 4

Process Example for ULK Film Repair

| Parameter | Station #1 | Station #2 | Station #3 | Station #4 |
|---|---|---|---|---|
| Wafer Temperature | 200-250° C. | 200-250° C. | 200-250° C. | 200-250° C. |
| UV Intensity (% of full power) | 70% | 100% | 100% | 100% |
| Desired Spectral band | 300-400 nm | 220-250 nm | 220-250 nm | 220-250 nm |
| Gas Flow Rate | 10-25 slm | 10-25 slm | 5-12 slm | 5-12 slm |

While this invention has been described in terms of several embodiments, there are alterations, modifications, permutations, and substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and substitute equivalents as fall within the true spirit and scope of the present invention. The use of the singular in the claims does not mean "only one," but rather "one or more," unless otherwise stated in the claims.

What is claimed is:

1. A method of processing a semiconductor wafer, the method comprising:
providing the semiconductor wafer to a semiconductor processing chamber; and
performing, prior to removing the semiconductor wafer from the semiconductor processing chamber, a plurality of non-concurrent exposure operations on the semiconductor wafer providing wafer exposure characteristics differing in at least one of radiation intensity, radiation wavelength, spectral distribution, and set wafer support temperature of a wafer support that supports the semiconductor wafer, wherein each exposure operation comprises exposing the semiconductor wafer to ultraviolet radiation.

2. The method of claim 1, wherein the semiconductor processing chamber comprises at least two processing stations and wherein at least two of the exposure operations are performed in different processing stations of the semiconductor processing chamber.

3. The method of claim 2, wherein each processing station is configured to perform more than one of the exposure operations.

4. The method of claim 3, wherein two of the exposure operations performed in one of the processing stations vary in radiation intensity.

5. The method of claim 1, further comprising:
flowing helium gas into the semiconductor processing chamber.

6. The method of claim 1, further comprising:
flowing helium and argon gas into the semiconductor processing chamber.

7. The method of claim 1, further comprising:
flowing helium and argon gas into the semiconductor processing chamber at different rates for different exposure operations.

8. The method of claim 1, wherein etch-damaged low-k dielectric film is repaired.

9. The method of claim 1, wherein porogen is removed and bonds cross-linked in porous low-k dielectric films and wherein a same wafer temperature is maintained during each exposure operation.

10. The method of claim 1, wherein the plurality of exposure operations differ in radiation wavelength.

11. The method of claim 1, wherein the plurality of exposure operations differ in spectral distribution.

12. The method of claim 1, wherein the plurality of exposure operations differ in radiation intensity.

13. The method of claim 1, wherein the plurality of exposure operations differ in set wafer support temperature.

14. A method comprising a plurality of exposure operations wherein each exposure operation comprises exposing a substrate to ultraviolet radiation; and
wherein all operations are performed in the same semiconductor processing tool, and further wherein the plurality of exposure operations include:
a first UV exposure operation, said first UV exposure operation having the following UV exposure characteristics:
a pedestal temperature of at least about 400° C.;
a UV intensity of between about 35% and 70% of maximum UV intensity; and
a wavelength of between about 250 and 270 nm; and
a second UV exposure operation, said second UV exposure operation having the following UV exposure characteristics:
a pedestal temperature of between about 350° C. and 375° C.;
a UV intensity at about 100% of maximum UV intensity; and
a wavelength of between about 220 and 250 nm.

15. A method comprising a plurality of exposure operations wherein each exposure operation comprises exposing a substrate to ultraviolet radiation; and
wherein all operations are performed in the same semiconductor processing tool, and further wherein the plurality of exposure operations include:
a first UV exposure operation, said first UV exposure operation having the following UV exposure characteristics:
a first pedestal temperature,
a first UV intensity, and
a first wavelength; and a second UV exposure operation, said second UV exposure operation having the following UV exposure characteristics:
  a second pedestal temperature, wherein the second pedestal temperature is less than the first pedestal temperature,
  a second UV intensity, wherein the second UV intensity is greater than the first UV intensity, and
  a second wavelength wherein the second wavelength is less than the first wavelength.

16. A method of processing a semiconductor wafer, the method comprising:
  performing a plurality of non-concurrent exposure operations on the semiconductor wafer, the exposure operations providing wafer exposure characteristics differing in radiation wavelength and spectral distribution, wherein:
    each exposure operation comprises exposing the semiconductor wafer to ultraviolet radiation, and
    all of the exposure operations are performed in the same semiconductor processing tool.

* * * * *